United States Patent
Zercoe et al.

(10) Patent No.: US 10,128,061 B2
(45) Date of Patent: Nov. 13, 2018

(54) KEY AND SWITCH HOUSING FOR KEYBOARD ASSEMBLY

(71) Applicant: Apple Inc., Cupertino, CA (US)

(72) Inventors: Bradford J. Zercoe, Cupertino, CA (US); Craig C. Leong, Cupertino, CA (US); John M. Brock, San Carlos, CA (US); Keith J. Hendren, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/867,672

(22) Filed: Sep. 28, 2015

(65) Prior Publication Data

US 2016/0189891 A1 Jun. 30, 2016

Related U.S. Application Data

(60) Provisional application No. 62/058,074, filed on Sep. 30, 2014, provisional application No. 62/129,841,
(Continued)

(51) Int. Cl.
*H01H 9/26* (2006.01)
*H01H 13/72* (2006.01)
(Continued)

(52) U.S. Cl.
CPC ........... *H01H 13/06* (2013.01); *G06F 1/1662* (2013.01); *G06F 3/0202* (2013.01); *H01H 3/125* (2013.01);
(Continued)

(58) Field of Classification Search
CPC ............... H01H 13/85; H01H 2209/01; H01H 2215/00; H01H 2215/004;
(Continued)

(56) References Cited

U.S. PATENT DOCUMENTS 3,657,492 A 4/1972 Arndt et al.
3,917,917 A 11/1975 Murata
(Continued)

FOREIGN PATENT DOCUMENTS

CN 2155620 2/1994
CN 2394309 8/2000
(Continued)

OTHER PUBLICATIONS

Invitation to Pay Additional Fees, PCT/US2015/052743, 7 pages, dated Dec. 22, 2015.
(Continued)

*Primary Examiner* — Anthony R. Jimenez
(74) *Attorney, Agent, or Firm* — Dorsey & Whitney LLP

(57) ABSTRACT

A key and a switch housing for a keyboard assembly is disclosed. A switch housing for the keyboard assembly may include a body having a switch opening and a light source recess formed adjacent the switch opening. The switch opening may house or receive a dome switch for the keyboard assembly and the light source recess may house or receive a light source assembly configured to illuminate a keycap of the keyboard assembly. The switch housing also can include a top panel integrally formed and molded to a portion of the body. The top panel covers the switch opening formed in the body and the top panel is a light guide.

24 Claims, 14 Drawing Sheets

Related U.S. Application Data filed on Mar. 7, 2015, provisional application No. 62/058,067, filed on Sep. 30, 2014, provisional application No. 62/129,840, filed on Mar. 7, 2015, provisional application No. 62/058,087, filed on Sep. 30, 2014, provisional application No. 62/129,842, filed on Mar. 7, 2015, provisional application No. 62/058,081, filed on Sep. 30, 2014, provisional application No. 62/129,843, filed on Mar. 7, 2015.

(51) Int. Cl.

| | |
|---|---|
| *H01H 13/76* | (2006.01) |
| *H01H 13/06* | (2006.01) |
| *H01H 13/02* | (2006.01) |
| *H01L 33/50* | (2010.01) |
| *H01H 13/70* | (2006.01) |
| *G06F 1/16* | (2006.01) |
| *G06F 3/02* | (2006.01) |
| *H01H 3/12* | (2006.01) |
| *H01H 13/79* | (2006.01) |
| *H01H 13/80* | (2006.01) |
| *H01H 13/803* | (2006.01) |
| *H01H 13/83* | (2006.01) |
| *H01H 13/86* | (2006.01) |
| *H01H 13/04* | (2006.01) |

(52) U.S. Cl.
CPC .......... *H01H 13/023* (2013.01); *H01H 13/04* (2013.01); *H01H 13/70* (2013.01); *H01H 13/7006* (2013.01); *H01H 13/79* (2013.01); *H01H 13/80* (2013.01); *H01H 13/803* (2013.01); *H01H 13/83* (2013.01); *H01H 13/86* (2013.01); *H01L 33/50* (2013.01); *H01H 2203/004* (2013.01); *H01H 2203/038* (2013.01); *H01H 2203/056* (2013.01); *H01H 2205/016* (2013.01); *H01H 2205/024* (2013.01); *H01H 2207/04* (2013.01); *H01H 2211/028* (2013.01); *H01H 2213/01* (2013.01); *H01H 2213/016* (2013.01); *H01H 2215/038* (2013.01); *H01H 2219/036* (2013.01); *H01H 2219/052* (2013.01); *H01H 2219/06* (2013.01); *H01H 2219/062* (2013.01); *H01H 2221/076* (2013.01); *H01H 2227/026* (2013.01); *H01H 2229/046* (2013.01); *H01H 2239/004* (2013.01)

(58) Field of Classification Search
CPC ....... H01H 2215/024; H01H 2215/008; H01H 2215/012; H01H 2215/018; H01H 3/125; H01H 13/06; H01H 13/023; H01H 13/04; H01H 13/70; H01H 13/7006; H01H 13/79; H01H 13/80; H01H 13/803; H01H 13/83; H01H 13/86; H01H 2203/004; H01H 2203/038; H01H 2203/056; H01H 2205/016; H01H 2205/024; H01H 2207/04; H01H 2211/028; H01H 2213/01; H01H 2213/016; H01H 2215/038; H01H 2219/036; H01H 2219/052; H01H 2219/06; H01H 2219/062; H01H 2221/076; H01H 2227/026; H01H 2229/046; H01H 2239/004; G06F 1/1662; G06F 3/0202
USPC ....... 200/402, 405, 406, 408, 412, 440, 468, 200/5 A
See application file for complete search history.

(56) References Cited

U.S. PATENT DOCUMENTS

| | | |
|---|---|---|
| 3,978,297 A | 8/1976 | Lynn et al. |
| 4,095,066 A | 6/1978 | Harris |
| 4,319,099 A | 3/1982 | Asher |
| 4,349,712 A | 9/1982 | Michalski |
| 4,484,042 A | 11/1984 | Matsui |
| 4,596,905 A | 6/1986 | Fowler |
| 4,598,181 A | 7/1986 | Selby |
| 4,670,084 A | 6/1987 | Durand et al. |
| 4,755,645 A * | 7/1988 | Naoki ............... H01H 13/20 200/276.1 |
| 4,937,408 A | 6/1990 | Hattori et al. |
| 4,987,275 A | 1/1991 | Miller et al. |
| 5,021,638 A | 6/1991 | Nopper et al. |
| 5,092,459 A | 3/1992 | Uljanic et al. |
| 5,136,131 A | 8/1992 | Komaki |
| 5,278,372 A | 1/1994 | Takagi et al. |
| 5,280,146 A | 1/1994 | Inagaki et al. |
| 5,340,955 A | 8/1994 | Calvillo et al. |
| 5,382,762 A | 1/1995 | Mochizuki |
| 5,397,867 A | 3/1995 | Demeo |
| 5,408,060 A | 4/1995 | Muurinen |
| 5,421,659 A | 6/1995 | Liang |
| 5,422,447 A | 6/1995 | Spence |
| 5,457,297 A | 10/1995 | Chen |
| 5,477,430 A | 12/1995 | LaRose et al. |
| 5,481,074 A | 1/1996 | English |
| 5,504,283 A | 4/1996 | Kako et al. |
| 5,512,719 A | 4/1996 | Okada et al. |
| 5,625,532 A | 4/1997 | Sellers |
| 5,804,780 A | 9/1998 | Bartha |
| 5,828,015 A | 10/1998 | Coulon |
| 5,847,337 A | 12/1998 | Chen |
| 5,874,700 A | 2/1999 | Hochgesang |
| 5,875,013 A | 2/1999 | Takahara |
| 5,876,106 A | 3/1999 | Kordecki et al. |
| 5,878,872 A | 3/1999 | Tsai |
| 5,881,866 A * | 3/1999 | Miyajima ............ H01H 13/705 200/314 |
| 5,898,147 A | 4/1999 | Domzaiski et al. |
| 5,924,555 A | 7/1999 | Sadamori et al. |
| 5,935,691 A | 8/1999 | Tsai |
| 5,960,942 A | 10/1999 | Thornton |
| 5,986,227 A | 11/1999 | Hon |
| 6,020,565 A | 2/2000 | Pan |
| 6,068,416 A | 5/2000 | Kumamoto et al. |
| 6,215,420 B1 | 4/2001 | Harrison et al. |
| 6,257,782 B1 | 7/2001 | Maruyama et al. |
| 6,259,046 B1 | 7/2001 | Iwama et al. |
| 6,377,685 B1 | 4/2002 | Krishnan |
| 6,388,219 B2 | 5/2002 | Hsu et al. |
| 6,423,918 B1 | 7/2002 | King et al. |
| 6,482,032 B1 | 11/2002 | Szu et al. |
| 6,530,283 B2 | 3/2003 | Okada et al. |
| 6,538,801 B2 | 3/2003 | Jacobson et al. |
| 6,542,355 B1 | 4/2003 | Huang |
| 6,552,287 B2 | 4/2003 | Janniere |
| 6,556,112 B1 | 4/2003 | Van Zeeland et al. |
| 6,559,399 B2 | 5/2003 | Hsu et al. |
| 6,560,612 B1 | 5/2003 | Yamada et al. |
| 6,572,289 B2 | 6/2003 | Lo et al. |
| 6,573,463 B2 | 6/2003 | Ono |
| 6,585,435 B2 | 7/2003 | Fang |
| 6,624,369 B2 | 9/2003 | Ito et al. |
| 6,706,986 B2 | 3/2004 | Hsu |
| 6,738,050 B2 | 5/2004 | Comiskey |
| 6,750,414 B2 | 6/2004 | Sullivan |
| 6,759,614 B2 | 7/2004 | Yoneyama |
| 6,762,381 B2 | 7/2004 | Kunthady et al. |
| 6,765,503 B1 | 7/2004 | Chan et al. |
| 6,788,450 B2 | 9/2004 | Kawai et al. |
| 6,797,906 B2 | 9/2004 | Ohashi |
| 6,850,227 B2 | 2/2005 | Takahashi et al. |
| 6,860,660 B2 | 3/2005 | Hochgesang et al. |
| 6,911,608 B2 | 6/2005 | Levy |

(56) References Cited

U.S. PATENT DOCUMENTS

| | | | |
|---|---|---|---|
| 6,926,418 B2 * | 8/2005 | Ostergård | H04M 1/22 362/23.01 |
| 6,940,030 B2 | 9/2005 | Takeda et al. | |
| 6,977,352 B2 | 12/2005 | Oosawa | |
| 6,979,792 B1 | 12/2005 | Lai | |
| 6,987,466 B1 | 1/2006 | Welch et al. | |
| 6,987,503 B2 | 1/2006 | Inoue | |
| 7,012,206 B2 | 3/2006 | Oikawa | |
| 7,030,330 B2 | 4/2006 | Suda | |
| 7,038,832 B2 | 5/2006 | Kanbe | |
| 7,129,930 B1 | 10/2006 | Cathey et al. | |
| 7,134,205 B2 | 11/2006 | Bruennel | |
| 7,146,701 B2 | 12/2006 | Mahoney et al. | |
| 7,151,236 B2 | 12/2006 | Ducruet et al. | |
| 7,151,237 B2 | 12/2006 | Mahoney et al. | |
| 7,154,059 B2 | 12/2006 | Chou | |
| 7,166,813 B2 | 1/2007 | Soma | |
| 7,172,303 B2 | 2/2007 | Shipman et al. | |
| 7,189,932 B2 * | 3/2007 | Kim | H01H 25/041 200/17 R |
| 7,256,766 B2 | 8/2007 | Albert et al. | |
| 7,283,119 B2 | 10/2007 | Kishi | |
| 7,301,113 B2 | 11/2007 | Nishimura et al. | |
| 7,312,790 B2 | 12/2007 | Sato et al. | |
| 7,378,607 B2 | 5/2008 | Koyano et al. | |
| 7,385,806 B2 | 6/2008 | Liao | |
| 7,391,555 B2 | 6/2008 | Albert et al. | |
| 7,414,213 B2 | 8/2008 | Hwang | |
| 7,429,707 B2 | 9/2008 | Yanai et al. | |
| 7,432,460 B2 | 10/2008 | Clegg | |
| 7,510,342 B2 | 3/2009 | Lane et al. | |
| 7,531,764 B1 | 5/2009 | Lev et al. | |
| 7,541,554 B2 | 6/2009 | Hou | |
| 7,589,292 B2 * | 9/2009 | Jung | H01H 13/83 200/314 |
| 7,639,187 B2 | 12/2009 | Caballero et al. | |
| 7,639,571 B2 | 12/2009 | Ishii et al. | |
| 7,651,231 B2 | 1/2010 | Chou et al. | |
| 7,679,010 B2 | 3/2010 | Wingett | |
| 7,724,415 B2 | 5/2010 | Yamaguchi | |
| 7,781,690 B2 | 8/2010 | Ishii | |
| 7,813,774 B2 | 10/2010 | Perez-Noguera | |
| 7,842,895 B2 | 11/2010 | Lee | |
| 7,847,204 B2 | 12/2010 | Tsai | |
| 7,851,819 B2 | 12/2010 | Shi | |
| 7,866,866 B2 | 1/2011 | Wahlstrom | |
| 7,893,376 B2 | 2/2011 | Chen | |
| 7,923,653 B2 | 4/2011 | Ohsumi | |
| 7,947,915 B2 | 5/2011 | Lee et al. | |
| 7,999,748 B2 | 8/2011 | Ligtenberg et al. | |
| 8,063,325 B2 | 11/2011 | Sung et al. | |
| 8,077,096 B2 | 12/2011 | Chiang et al. | |
| 8,080,744 B2 | 12/2011 | Yeh et al. | |
| 8,098,228 B2 | 1/2012 | Shimodaira et al. | |
| 8,109,650 B2 | 2/2012 | Chang et al. | |
| 8,119,945 B2 | 2/2012 | Lin | |
| 8,124,903 B2 | 2/2012 | Tatehata et al. | |
| 8,134,094 B2 | 3/2012 | Tsao et al. | |
| 8,143,982 B1 | 3/2012 | Lauder et al. | |
| 8,156,172 B2 | 4/2012 | Muehl et al. | |
| 8,178,808 B2 | 5/2012 | Strittmatter et al. | |
| 8,184,021 B2 | 5/2012 | Chou | |
| 8,212,160 B2 | 7/2012 | Tsao | |
| 8,212,162 B2 | 7/2012 | Zhou | |
| 8,218,301 B2 | 7/2012 | Lee | |
| 8,232,958 B2 | 7/2012 | Tolbert | |
| 8,246,228 B2 | 8/2012 | Ko et al. | |
| 8,253,048 B2 | 8/2012 | Ozias et al. | |
| 8,253,052 B2 | 9/2012 | Chen | |
| 8,263,887 B2 | 9/2012 | Chen et al. | |
| 8,289,280 B2 | 10/2012 | Travis | |
| 8,299,382 B2 | 10/2012 | Takemae et al. | |
| 8,317,384 B2 | 11/2012 | Chung et al. | |
| 8,319,298 B2 | 11/2012 | Hsu | |
| 8,325,141 B2 | 12/2012 | Marsden | |
| 8,330,725 B2 | 12/2012 | Mahowald et al. | |
| 8,354,629 B2 | 1/2013 | Lin | |
| 8,378,857 B2 | 2/2013 | Pance | |
| 8,384,566 B2 | 2/2013 | Bocirnea | |
| 8,404,990 B2 * | 3/2013 | Lutgring | H01H 9/22 200/520 |
| 8,451,146 B2 | 3/2013 | Mahowald et al. | |
| 8,431,849 B2 | 4/2013 | Chen | |
| 8,436,265 B2 | 5/2013 | Koike et al. | |
| 8,462,514 B2 | 6/2013 | Myers et al. | |
| 8,500,348 B2 | 8/2013 | Dumont et al. | |
| 8,502,094 B2 | 8/2013 | Chen | |
| 8,542,194 B2 | 9/2013 | Akens et al. | |
| 8,548,528 B2 | 10/2013 | Kim et al. | |
| 8,564,544 B2 | 10/2013 | Jobs et al. | |
| 8,569,639 B2 | 10/2013 | Strittmatter | |
| 8,575,632 B2 | 11/2013 | Kuramoto et al. | |
| 8,581,127 B2 | 11/2013 | Jhuang et al. | |
| 8,592,699 B2 | 11/2013 | Kessler et al. | |
| 8,592,702 B2 | 11/2013 | Tsai | |
| 8,592,703 B2 | 11/2013 | Johnson et al. | |
| 8,604,370 B2 | 12/2013 | Chao | |
| 8,629,362 B1 | 1/2014 | Knighton et al. | |
| 8,642,904 B2 | 2/2014 | Chiba et al. | |
| 8,651,720 B2 | 2/2014 | Sherman et al. | |
| 8,659,882 B2 | 2/2014 | Liang et al. | |
| 8,731,618 B2 | 5/2014 | Jarvis et al. | |
| 8,748,767 B2 | 6/2014 | Ozias et al. | |
| 8,759,705 B2 | 6/2014 | Funakoshi et al. | |
| 8,760,405 B2 | 6/2014 | Nam | |
| 8,786,548 B2 | 7/2014 | Oh et al. | |
| 8,791,378 B2 | 7/2014 | Lan | |
| 8,835,784 B2 | 9/2014 | Hirota | |
| 8,847,090 B2 | 9/2014 | Ozaki | |
| 8,847,711 B2 | 9/2014 | Yang et al. | |
| 8,853,580 B2 | 10/2014 | Chen | |
| 8,854,312 B2 | 10/2014 | Meierling | |
| 8,870,477 B2 | 10/2014 | Merminod et al. | |
| 8,884,174 B2 | 11/2014 | Chou et al. | |
| 8,921,473 B1 | 12/2014 | Hyman | |
| 8,922,476 B2 | 12/2014 | Stewart et al. | |
| 8,943,427 B2 | 1/2015 | Heo et al. | |
| 8,976,117 B2 | 3/2015 | Krahenbuhl et al. | |
| 8,994,641 B2 | 3/2015 | Stewart et al. | |
| 9,007,297 B2 | 4/2015 | Stewart et al. | |
| 9,012,795 B2 | 4/2015 | Niu et al. | |
| 9,029,723 B2 | 5/2015 | Pegg | |
| 9,063,627 B2 | 6/2015 | Yairi et al. | |
| 9,064,642 B2 | 6/2015 | Welch et al. | |
| 9,086,733 B2 | 7/2015 | Pance | |
| 9,087,663 B2 | 7/2015 | Los | |
| 9,093,229 B2 | 7/2015 | Leong et al. | |
| 9,213,416 B2 | 12/2015 | Chen | |
| 9,223,352 B2 | 12/2015 | Smith et al. | |
| 9,234,486 B2 | 1/2016 | Das et al. | |
| 9,235,236 B2 | 1/2016 | Nam | |
| 9,274,654 B2 | 3/2016 | Slobodin et al. | |
| 9,275,810 B2 | 3/2016 | Pance et al. | |
| 9,300,033 B2 | 3/2016 | Han et al. | |
| 9,305,496 B2 | 4/2016 | Kimura | |
| 9,443,672 B2 | 9/2016 | Martisauskas | |
| 9,448,628 B2 | 9/2016 | Tan et al. | |
| 9,471,185 B2 | 10/2016 | Guard | |
| 9,477,382 B2 | 10/2016 | Hicks et al. | |
| 9,612,674 B2 | 4/2017 | Degner et al. | |
| 9,734,965 B2 | 8/2017 | Martinez et al. | |
| 9,793,066 B1 | 10/2017 | Brock et al. | |
| 2002/0079211 A1 | 6/2002 | Katayama et al. | |
| 2002/0093436 A1 | 7/2002 | Lien | |
| 2002/0113770 A1 | 8/2002 | Jacobson et al. | |
| 2002/0149835 A1 | 10/2002 | Kanbe | |
| 2003/0169232 A1 | 9/2003 | Ito | |
| 2004/0004559 A1 | 1/2004 | Rast | |
| 2004/0225965 A1 | 11/2004 | Garside et al. | |
| 2004/0257247 A1 | 12/2004 | Lin et al. | |
| 2005/0035950 A1 | 2/2005 | Daniels | |
| 2005/0253801 A1 | 11/2005 | Kobayashi | |
| 2006/0011458 A1 | 1/2006 | Purcocks | |
| 2006/0020469 A1 | 1/2006 | Rast | |

(56) References Cited

U.S. PATENT DOCUMENTS

| | | |
|---|---|---|
| 2006/0120790 A1 | 6/2006 | Chang |
| 2006/0181511 A1 | 8/2006 | Woolley |
| 2006/0243987 A1 | 11/2006 | Lai |
| 2007/0200823 A1 | 8/2007 | Bytheway et al. |
| 2007/0285393 A1 | 12/2007 | Ishakov |
| 2008/0131184 A1 | 6/2008 | Brown et al. |
| 2008/0136782 A1 | 6/2008 | Mundt et al. |
| 2008/0251370 A1 | 10/2008 | Aoki |
| 2009/0046053 A1 | 2/2009 | Shigehiro et al. |
| 2009/0103964 A1 | 4/2009 | Takagi et al. |
| 2009/0128496 A1 | 5/2009 | Huang |
| 2009/0262085 A1 | 10/2009 | Wassingbo et al. |
| 2009/0267892 A1 | 10/2009 | Faubert |
| 2010/0045705 A1 | 2/2010 | Vertegaal et al. |
| 2010/0066568 A1 | 3/2010 | Lee |
| 2010/0109921 A1 | 5/2010 | Annerfors |
| 2010/0156796 A1 | 6/2010 | Kim et al. |
| 2010/0253630 A1 | 10/2010 | Homma et al. |
| 2011/0032127 A1 | 2/2011 | Roush |
| 2011/0056817 A1 | 3/2011 | Wu |
| 2011/0056836 A1 | 3/2011 | Tatebe et al. |
| 2011/0205179 A1 | 8/2011 | Braun |
| 2011/0261031 A1 | 10/2011 | Muto |
| 2011/0267272 A1 | 11/2011 | Meyer et al. |
| 2011/0284355 A1 | 11/2011 | Yang |
| 2011/0303521 A1 | 12/2011 | Niu et al. |
| 2012/0012446 A1 | 1/2012 | Hwa |
| 2012/0032972 A1 | 2/2012 | Hwang |
| 2012/0048702 A1* | 3/2012 | Liu ............... H01H 3/125 200/5 A |
| 2012/0090973 A1 | 4/2012 | Liu |
| 2012/0098751 A1 | 4/2012 | Liu |
| 2012/0286701 A1 | 11/2012 | Yang et al. |
| 2012/0298496 A1 | 11/2012 | Zhang |
| 2012/0313856 A1 | 12/2012 | Hsieh |
| 2013/0043115 A1 | 2/2013 | Yang et al. |
| 2013/0093500 A1 | 4/2013 | Bruwer |
| 2013/0093733 A1 | 4/2013 | Yoshida |
| 2013/0100030 A1 | 4/2013 | Los et al. |
| 2013/0120265 A1 | 5/2013 | Horii et al. |
| 2013/0161170 A1 | 6/2013 | Fan et al. |
| 2013/0215079 A1 | 8/2013 | Johnson et al. |
| 2013/0242601 A1 | 9/2013 | Kloeppel et al. |
| 2013/0270090 A1 | 10/2013 | Lee |
| 2014/0015777 A1 | 1/2014 | Park et al. |
| 2014/0027259 A1 | 1/2014 | Kawana et al. |
| 2014/0071654 A1 | 3/2014 | Chien |
| 2014/0082490 A1 | 3/2014 | Jung et al. |
| 2014/0090967 A1 | 4/2014 | Inagaki |
| 2014/0098042 A1 | 4/2014 | Kuo et al. |
| 2014/0116865 A1 | 5/2014 | Leong et al. |
| 2014/0118264 A1 | 5/2014 | Leong et al. |
| 2014/0151211 A1 | 6/2014 | Zhang |
| 2014/0184496 A1 | 7/2014 | Gribetz et al. |
| 2014/0191973 A1 | 7/2014 | Zellers et al. |
| 2014/0218851 A1 | 8/2014 | Klein et al. |
| 2014/0252881 A1 | 9/2014 | Dinh et al. |
| 2014/0291133 A1 | 10/2014 | Fu et al. |
| 2014/0320436 A1 | 10/2014 | Modarres et al. |
| 2014/0346025 A1 | 11/2014 | Hendren et al. |
| 2014/0375141 A1 | 12/2014 | Nakajima |
| 2015/0016038 A1 | 1/2015 | Niu et al. |
| 2015/0083561 A1 | 3/2015 | Han et al. |
| 2015/0090570 A1 | 4/2015 | Kwan et al. |
| 2015/0090571 A1 | 4/2015 | Leong et al. |
| 2015/0227207 A1 | 8/2015 | Winter et al. |
| 2015/0243457 A1 | 8/2015 | Niu et al. |
| 2015/0270073 A1 | 9/2015 | Yarak, III et al. |
| 2015/0277559 A1 | 10/2015 | Vescovi et al. |
| 2015/0287553 A1 | 10/2015 | Welch et al. |
| 2015/0309538 A1 | 10/2015 | Zhang |
| 2015/0332874 A1 | 11/2015 | Brock et al. |
| 2015/0348726 A1 | 12/2015 | Hendren |
| 2015/0378391 A1 | 12/2015 | Huitema et al. |
| 2016/0049266 A1 | 2/2016 | Stringer et al. |
| 2016/0093452 A1 | 3/2016 | Zercoe et al. |
| 2016/0172129 A1 | 6/2016 | Zercoe et al. |
| 2016/0189890 A1 | 6/2016 | Leong et al. |
| 2016/0189891 A1 | 6/2016 | Zercoe et al. |
| 2016/0259375 A1 | 9/2016 | Andre et al. |
| 2016/0329166 A1 | 11/2016 | Hou et al. |
| 2016/0336124 A1 | 11/2016 | Leong et al. |
| 2016/0336127 A1 | 11/2016 | Leong et al. |
| 2016/0336128 A1 | 11/2016 | Leong et al. |
| 2016/0343523 A1 | 11/2016 | Hendren et al. |
| 2016/0351360 A1 | 12/2016 | Knopf et al. |
| 2016/0365204 A1 | 12/2016 | Cao et al. |
| 2016/0378234 A1 | 12/2016 | Ligtenberg et al. |
| 2016/0379775 A1 | 12/2016 | Leong et al. |
| 2017/0004937 A1 | 1/2017 | Leong et al. |
| 2017/0004939 A1 | 1/2017 | Kwan et al. |
| 2017/0011869 A1 | 1/2017 | Knopf et al. |
| 2017/0090106 A1 | 3/2017 | Cao et al. |
| 2017/0301487 A1 | 10/2017 | Leong et al. |
| 2017/0315624 A1 | 11/2017 | Leong et al. |
| 2018/0029339 A1 | 2/2018 | Liu et al. |
| 2018/0040441 A1 | 2/2018 | Wu et al. |
| 2018/0074694 A1 | 3/2018 | Lehmann et al. |

FOREIGN PATENT DOCUMENTS

| | | |
|---|---|---|
| CN | 1533128 | 9/2004 |
| CN | 1542497 | 11/2004 |
| CN | 2672832 | 1/2005 |
| CN | 1624842 | 6/2005 |
| CN | 1812030 | 8/2006 |
| CN | 1838036 | 9/2006 |
| CN | 1855332 | 11/2006 |
| CN | 101051569 | 10/2007 |
| CN | 200961844 | 10/2007 |
| CN | 200986871 | 12/2007 |
| CN | 101146137 | 3/2008 |
| CN | 201054315 | 4/2008 |
| CN | 201084602 | 7/2008 |
| CN | 201123174 | 9/2008 |
| CN | 201149829 | 11/2008 |
| CN | 101315841 | 12/2008 |
| CN | 201210457 | 3/2009 |
| CN | 101438228 | 5/2009 |
| CN | 101465226 | 6/2009 |
| CN | 101494130 | 7/2009 |
| CN | 101502082 | 8/2009 |
| CN | 201298481 | 8/2009 |
| CN | 101546667 | 9/2009 |
| CN | 101572195 | 11/2009 |
| CN | 101800281 | 8/2010 |
| CN | 101807482 | 8/2010 |
| CN | 101868773 | 10/2010 |
| CN | 201655616 | 11/2010 |
| CN | 102110542 | 6/2011 |
| CN | 102119430 | 7/2011 |
| CN | 201904256 | 7/2011 |
| CN | 102163084 | 8/2011 |
| CN | 201927524 | 8/2011 |
| CN | 201945951 | 8/2011 |
| CN | 201945952 | 8/2011 |
| CN | 201956238 | 8/2011 |
| CN | 102197452 | 9/2011 |
| CN | 202008941 | 10/2011 |
| CN | 202040690 | 11/2011 |
| CN | 102280292 | 12/2011 |
| CN | 102338348 | 2/2012 |
| CN | 102375550 | 3/2012 |
| CN | 202205161 | 4/2012 |
| CN | 102496509 | 6/2012 |
| CN | 10269527 | 8/2012 |
| CN | 102622089 | 8/2012 |
| CN | 102629526 | 8/2012 |
| CN | 202372927 | 8/2012 |
| CN | 102679239 | 9/2012 |
| CN | 102683072 | 9/2012 |
| CN | 202434387 | 9/2012 |
| CN | 202523007 | 11/2012 |
| CN | 102832068 | 12/2012 |

(56) References Cited

FOREIGN PATENT DOCUMENTS

| | | |
|---|---|---|
| CN | 102955573 | 3/2013 |
| CN | 102956386 | 3/2013 |
| CN | 102969183 | 3/2013 |
| CN | 103000417 | 3/2013 |
| CN | 103165327 | 6/2013 |
| CN | 103180979 | 6/2013 |
| CN | 203012648 | 6/2013 |
| CN | 203135988 | 8/2013 |
| CN | 103377841 | 10/2013 |
| CN | 103489986 | 1/2014 |
| CN | 203414880 | 1/2014 |
| CN | 103681056 | 3/2014 |
| CN | 103699181 | 4/2014 |
| CN | 203520312 | 4/2014 |
| CN | 203588895 | 5/2014 |
| CN | 103839715 | 6/2014 |
| CN | 103839720 | 6/2014 |
| CN | 103839722 | 6/2014 |
| CN | 103903891 | 7/2014 |
| CN | 103956290 | 7/2014 |
| CN | 203733685 | 7/2014 |
| CN | 104021968 | 9/2014 |
| CN | 204102769 | 1/2015 |
| CN | 204117915 | 1/2015 |
| CN | 104517769 | 4/2015 |
| CN | 204632641 | 9/2015 |
| CN | 105097341 | 11/2015 |
| DE | 2530176 | 1/1977 |
| DE | 3002772 | 7/1981 |
| DE | 29704100 | 4/1997 |
| DE | 202008001970 | 8/2008 |
| EP | 0441993 | 8/1991 |
| EP | 1835272 | 9/2007 |
| EP | 1928008 | 6/2008 |
| EP | 2022606 | 6/2010 |
| EP | 2426688 | 3/2012 |
| EP | 2439760 | 4/2012 |
| EP | 2463798 | 6/2012 |
| EP | 2664979 | 11/2013 |
| FR | 2147420 | 3/1973 |
| FR | 2911000 | 7/2008 |
| FR | 2950193 | 3/2011 |
| GB | 1361459 | 7/1974 |
| JP | S50115562 | 9/1975 |
| JP | S60055477 | 3/1985 |
| JP | S61172422 | 10/1986 |
| JP | S62072429 | 4/1987 |
| JP | S63182024 | 11/1988 |
| JP | H0422024 | 4/1992 |
| JP | H0520963 | 1/1993 |
| JP | H0524512 | 8/1993 |
| JP | 05-342944 * | 12/1993 ............ H01H 13/20 |
| JP | H05342944 | 12/1993 |
| JP | H09204148 | 8/1997 |
| JP | H10312726 | 11/1998 |
| JP | H11194882 | 7/1999 |
| JP | 2000010709 | 1/2000 |
| JP | 2000057871 | 2/2000 |
| JP | 2000339097 | 12/2000 |
| JP | 2001100889 | 4/2001 |
| JP | 2003114751 | 9/2001 |
| JP | 2002260478 | 9/2002 |
| JP | 2002298689 | 10/2002 |
| JP | 2003522998 | 7/2003 |
| JP | 2005108041 | 4/2005 |
| JP | 2006164929 | 6/2006 |
| JP | 2006185906 | 7/2006 |
| JP | 2006521664 | 9/2006 |
| JP | 2006269439 | 10/2006 |
| JP | 2006277013 | 10/2006 |
| JP | 2006344609 | 12/2006 |
| JP | 2007115633 | 5/2007 |
| JP | 2007514247 | 5/2007 |
| JP | 2007156983 | 6/2007 |
| JP | 2008021428 | 1/2008 |
| JP | 2008041431 | 2/2008 |
| JP | 2008100129 | 5/2008 |
| JP | 2008191850 | 8/2008 |
| JP | 2008533559 | 8/2008 |
| JP | 2008293922 | 12/2008 |
| JP | 2009099503 | 5/2009 |
| JP | 2009181894 | 8/2009 |
| JP | 2010061956 | 3/2010 |
| JP | 2010244088 | 10/2010 |
| JP | 2010244302 | 10/2010 |
| JP | 2011018484 | 1/2011 |
| JP | 2011065126 | 3/2011 |
| JP | 2011150804 | 8/2011 |
| JP | 2011165630 | 8/2011 |
| JP | 2011524066 | 8/2011 |
| JP | 2011187297 | 9/2011 |
| JP | 2012022473 | 2/2012 |
| JP | 2012043705 | 3/2012 |
| JP | 2012063630 | 3/2012 |
| JP | 2012098873 | 5/2012 |
| JP | 2012134064 | 7/2012 |
| JP | 2012186067 | 9/2012 |
| JP | 2012230256 | 11/2012 |
| JP | 2014017179 | 1/2014 |
| JP | 2014026807 | 2/2014 |
| JP | 2014216190 | 11/2014 |
| JP | 2014220039 | 11/2014 |
| JP | 2016053778 | 4/2016 |
| KR | 1019990007394 | 1/1999 |
| KR | 1020020001668 | 1/2002 |
| KR | 100454203 | 10/2004 |
| KR | 1020060083032 | 7/2006 |
| KR | 1020080064116 | 7/2008 |
| KR | 1020080066164 | 7/2008 |
| KR | 2020110006385 | 6/2011 |
| KR | 1020120062797 | 6/2012 |
| KR | 1020130040131 | 4/2013 |
| KR | 20150024201 | 3/2015 |
| TW | 200703396 | 1/2007 |
| TW | M334397 | 6/2008 |
| TW | 201108284 | 3/2011 |
| TW | 201108286 | 3/2011 |
| TW | M407429 | 7/2011 |
| TW | 201246251 | 11/2012 |
| TW | 201403646 | 1/2014 |
| WO | WO9744946 | 11/1997 |
| WO | WO2005/057320 | 6/2005 |
| WO | WO2006/022313 | 3/2006 |
| WO | WO2007/049253 | 5/2007 |
| WO | WO2008/045833 | 4/2008 |
| WO | WO2009/005026 | 1/2009 |
| WO | WO2012/011282 | 1/2012 |
| WO | WO2012/027978 | 3/2012 |
| WO | WO2013/096478 | 6/2013 |
| WO | WO2014175446 | 10/2014 |

OTHER PUBLICATIONS

Elekson, "Reliable and Tested Wearable Electronics Embedment Solutions," http://www.wearable.technology/our-technologies, 3 pages, at least as early as Jan. 6, 2016.

* cited by examiner

KEY AND SWITCH HOUSING FOR KEYBOARD ASSEMBLY

CROSS-REFERENCE TO RELATED APPLICATIONS

This application is a non-provisional patent application of and claims the benefit to U.S. Provisional Patent Application No. 62/058,074, filed Sep. 30, 2014 and titled "Keyboard Assembly," U.S. Provisional Patent Application No. 62/129,841, filed Mar. 7, 2015, and titled "Key for Keyboard Assembly," U.S. Provisional Patent Application No. 62/058,067, filed Sep. 30, 2014 and titled "Keyboard Assembly," U.S. Provisional Patent Application No. 62/129,840, filed Mar. 7, 2015, and titled "Dome Switch for Keyboard Assembly," U.S. Provisional Patent Application No. 62/058,087, filed Sep. 30, 2014, and titled "Keyboard Assembly," U.S. Provisional Patent Application No. 62/129,842, filed Mar. 7, 2015, and titled "Venting System for Keyboard Assembly," U.S. Provisional Patent Application No. 62/058,081, filed Sep. 30, 2014, and titled "Keyboard Assembly," and U.S. Provisional Patent Application No. 62/129,843, filed Mar. 7, 2015, and titled "Light Assembly for Keyboard Assembly," the disclosures of which are hereby incorporated herein by reference in their entirety.

FIELD

The disclosure relates generally to a keyboard assembly for an electronic device and, more particularly, to components of a key and a switch housing for the keyboard assembly key.

BACKGROUND

Electronic devices typically include one or more input devices such as keyboards, touchpads, mice, or touchscreens to enable a user to interact with the device. These devices can be integrated into an electronic device or can stand alone as discrete devices that can transmit signals to another device via wired or wireless connection. For example, a keyboard can be integrated into the casing of a laptop computer. When integrated within the casing of the laptop computer, all of the components of the keyboard must be included within the casing of the laptop computer.

However, as the overall size of the electronic device is reduced, the available space for the keyboard and its various components is also reduced. As a result, the size of the components of the keyboard may be required to be reduced. With a reduction in size and material used to form the various components, the strength and, ultimately, the operational life of the component may be reduced. This may cause the operational life of the keyboard assembly and/or electronic device to be reduced as well.

In one example, a keycap of a keyboard assembly may be reduced in size to compensate for the reduction in available space in conventional electronic devices. The reduction in the keycap size may increase the risk of operational failure of the keycap and/or may increase the damage to the keycap and/or its distinct portions. For example, connection portions of the keycap utilized to couple the keycap to a housing and/or hinge of the keyboard assembly may be weakened when the size and/or material of the keycap is reduced. If a connection portion is damaged, the keycap may no longer be coupled to the keyboard assembly resulting in an inoperable key input to the keyboard assembly.

In another example, internal components of the keyboard, such as a switch housing for a dome switch, may be reduced in size and material to compensate for the reduction in available space in conventional electronic devices. The switch housing may protect the dome switch and provide structure and/or support for each key in the keyboard assembly. Like the keycap, a reduction in the size and/or material used to form the switch housing may increase the risk of operational failure of the switch housing and/or damage to the switch housing and/or other components positioned within the keyboard assembly. Furthermore, a reduction in the size and/or material used for the switch housing may negatively affect other features of the switch housing as well. For example, where a switch housing aids in light dispersal to illuminate the keyboard assembly, a reduction in the size of the switch housing may also cause a reduction in the ability of the switch housing to disperse light within the keyboard assembly.

SUMMARY

A switch housing for a keyboard assembly is disclosed. The switch housing comprising a body having a switch opening and a light source recess formed adjacent the switch opening. The switch housing also comprises a top panel integrally formed and molded to a portion of the body. The top panel covers the switch opening formed in the body and the top panel is a light guide.

A keyboard assembly is disclosed. The keyboard assembly comprises a switch housing having a body that comprises a switch opening and a top panel integrally formed and molded to a portion of the body. The top panel covers the switch opening. The keyboard assembly also comprises a keycap positioned above the switch housing. The keycap is coupled to a hinge mechanism for moving the keycap from a rest or undepressed state to a depressed state.

A keyboard assembly is disclosed. The keyboard assembly comprises a printed circuit board (PCB) and a hinge mechanism coupled directly to the PCB. The hinge mechanism comprises one or more retention pins positioned on each end of the hinge mechanism. The keyboard assembly also comprises a keycap releasably coupled to the hinge mechanism. The keycap comprises first retaining members positioned on a first side of the keycap. The first retaining members comprise a snap-fit releasably coupled to the retention pins. The keycap also comprises second retaining members positioned on a second side of the keycap opposite the first side. The second retaining members comprise a slide-retention fit releasably coupled to the retention pins. The slide-retention fit comprises a ledge portion contacting the retention pins and a protrusion wall positioned adjacent the ledge portion.

A method of removing a keycap from a keyboard assembly. The method comprises applying a force in a first direction on a first side of the keycap. The first side of the keycap comprises a snap-fit releasably coupled to a retention pin of a hinge mechanism of the keyboard assembly. The method also comprises applying a force in a second direction on a second side of the keycap. The second side of the keycap comprises a slide-retention fit releasably coupled to a distinct retention pin of the hinge mechanism. Additionally, the method comprises applying a force in the first direction on the second side of the keycap.

A key is disclosed. The key comprises a keycap comprising a set of retention pins positioned on a first side and a second side of the keycap. The key also comprises a printed circuit board (PCB) and a V-shaped structure coupled directly to the PCB and configured to connect the keycap to the PCB. The V-shaped structure comprises a first arm and a snap-fit positioned on the first arm of the V-shaped structure. The snap-fit is releasably coupled to the retention pins positioned on the first side of the keycap. The V-shaped structure also comprises a second arm and a slide-retention fit positioned on the second arm. The slide-retention fit is releasably coupled to the retention pins positioned on the second side of the keycap. Additionally, the V-shaped structure comprises a third retaining feature positioned on the first arm of the V-shaped structure opposite the snap-fit. The third retaining feature secures the first arm to the PCB.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to a keyboard assembly for an electronic device and, more particularly, to components of a key and a switch housing for the keyboard assembly.

In a particular embodiment, a key for the keyboard assembly may have a keycap attached to a hinge mechanism having a group of retaining features for securing the keycap within the keyboard assembly. Specifically, the retaining features of the hinge mechanism may secure the hinge mechanism to a layer (e.g., printed circuit board) of the keyboard assembly. Likewise, retaining features of the keycap may secure the keycap to the hinge mechanism. The retaining features may be formed as a variety of coupling mechanisms, including, but not limited to, snap-fits, slide-fits, ball-and-socket fits, magnetic fit, or any combination of fits. The retaining features may aid in the removal of the keycap from the keyboard assembly without damaging the keycap, the hinge mechanism, and/or other components of the key for the keyboard assembly.

In addition, the key for the keyboard assembly may also have a switch housing that houses or otherwise encompasses a dome switch and a light source (e.g., light emitting diode). The switch housing may be formed using a double-shot molding process such that a body of the switch housing is formed from a first material, and a top panel may be formed from a second material. The resulting switch housing may be a single integral piece formed by the body and the top panel. The top panel may be overmolded or otherwise formed over a switch opening in the body. Further, the top panel may extend over at least a portion of an upper surface of the body. The two distinct materials used to form the switch housing may have different, distinct structural and optical properties and/or characteristics. The switch housing may thus strengthen and/or protect certain elements of the keyboard assembly (including the aforementioned switch and light source). In some embodiments, the top panel may act as a light guide and thus may and disperse light from the light source toward the keycap to illuminate the keyboard assembly.

These and other embodiments are discussed below with reference to FIGS. 1-10. However, those skilled in the art will readily appreciate that the detailed description given herein with respect to these Figures is for explanatory purposes only and should not be construed as limiting.

Figure 1:
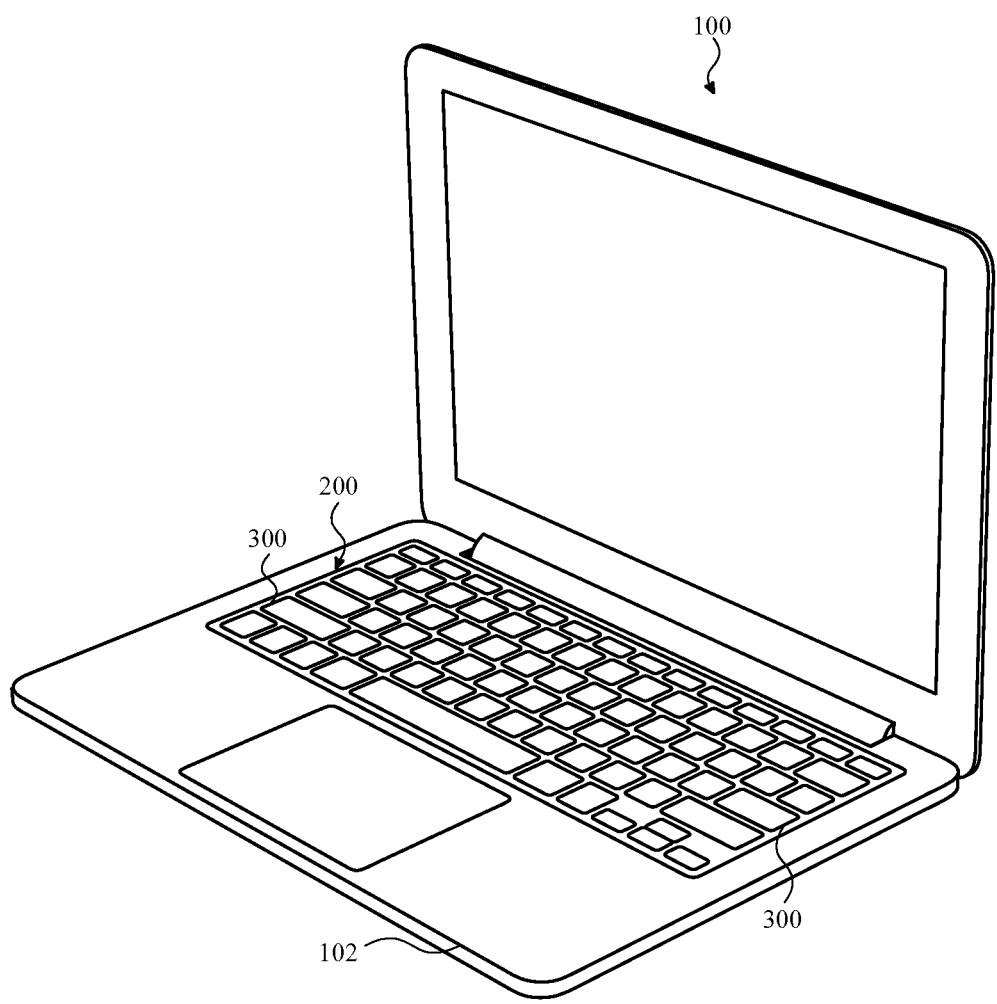
FIG. 1 shows an electronic device including a low-travel keyboard assembly, according to embodiments.

FIG. 1 shows an electronic device 100 including a low-travel keyboard assembly 200 that may incorporate a releasably keycap and a dome switch housing, as described in more detail below with respect to FIGS. 2-10. In a non-limiting example, as shown in FIG. 1, electronic device 100 may be a laptop computer. However, it is understood that electronic device 100 may be configured as any suitable electronic device that may utilize low-travel keyboard assembly 200. Other embodiments can implement electronic device 100 differently, such as, for example, a desktop computer, a tablet computing device, a smartphone, a gaming device, a display, a digital music player, a wearable computing device or display, a health monitoring device, and so on.

Electronic device 100 may include a top case 102. Top case 102 may take the form of an exterior, protective casing or shell for electronic device 100 and the various internal components (for example, low-travel keyboard assembly 200) of electronic device 100. Top case 102 may be formed as a single, integral component or may have a group of distinct components that may be configured to be coupled to one another, as discussed herein. Additionally, top case 102 may be formed from any suitable material that provides a protective casing or shell for electronic device 100 and the various components included in electronic device 100. In non-limiting examples, top case 102 may be made from metal, a ceramic, a rigid plastic or another polymer, a fiber-matrix composite, and so on.

Low-travel keyboard assembly 200 may be included within electronic device 100 to allow a user to interact with electronic device 100. As shown in FIG. 1, low-travel keyboard assembly 200 is positioned within and/or may be received by top case 102 of electronic device 100. Low-travel keyboard assembly 200 may include a set of keycaps 300 positioned within and partially protruding through and/or surrounded by top case 102 of electronic device 100. As discussed herein, keycaps 300 are depressed and displaced to interact and/or collapse a dome switch of low-travel keyboard assembly 200, which in turn forms an electrical signal or input to electronic device 100.

As discussed herein, keycap 300 and a hinge mechanism of low-travel keyboard assembly 200 each have a group of retaining features for securing keycap 300 within keyboard assembly 200. The retaining features are formed as a variety of coupling mechanisms, including but not limited to, snap-fits, slide-fits, ball-and-socket fits, magnetic fit, or any combination of fits. The utilization of the retaining features in keycap 300 and the hinge mechanism of low-travel keyboard assembly 200 allows a first end of keycap 300 to be uncoupled from low-travel keyboard assembly 200 by applying a force at the first end. Once the first end is uncoupled from the hinge mechanism, the second end can be uncoupled by applying minimal force and/or simply moving keycap 300 in a direction to uncouple the second end. Coupling the keycap 300 to hinge mechanism can be achieved by completing the process in reverse order. The uncoupling/coupling process of keycap 300 reduces the forces applied to keycap 300, which in turn lowers the stress experienced by keycap 300 and/or hinge mechanism of low-travel keyboard assembly 200. As a result, the retaining features aid in the removal of keycap 300 from low-travel keyboard assembly 200 and/or electronic device 100 without damaging or providing excess stress or wear on keycap 300, the hinge mechanism, and/or other components of keyboard assembly 200.

In addition, and as discussed herein, low-travel keyboard assembly 200 also includes a switch housing for housing a dome switch and a light source of the keyboard assembly 200. The switch housing can be formed using a double-shot molding process such that a body of the switch housing is formed from a first material, and a top panel operating as a light guide, integrally formed with the body portion, may be formed from a second material. The top panel may be formed over a switch opening of the switch housing and at least a portion of a top surface of the body portion of the switch housing. The top panel is also positioned below keycap 300, and is substantially contacted by keycap 300 when keycap 300 is depressed. The two distinct materials used to form the switch housing may include distinct structural and optical properties and/or characteristics to strengthen/protect the keyboard assembly and disperse light from the light source toward the keycap to illuminate the keyboard assembly. In non-limiting examples, the body portion of the switch housing can be formed from a rigid material that provides structure support to low-travel keyboard assembly 200, while the top panel portion is formed from a substantially compliant material. The compliant material allows the top panel of the switch housing to absorb at least a portion of the force applied by keycap 300 when keycap is depressed and/or preventing damage to distinct portions of keyboard assembly 200 (e.g., the dome switch, the body portion of the switch housing and so on) when keycap 300 is depressed. Additionally, the compliant material allows the top panel to deform or flex to contact the dome switch to form an electrical signal within electronic device 100, while also providing an intermediate layer between keycap 300 and the dome switch of keyboard assembly 200. Acting as an intermediate layer, the top panel of the switch housing increases the operational life of the dome switch and/or prevents damage to the dome switch by keycap 300.

In the non-limiting example shown in FIG. 1, where electronic device 100 is a laptop computer, low-travel keyboard assembly 200 may be positioned within and/or may be received by electronic device 100, as discussed herein. In an additional embodiment, low-travel keyboard assembly 200 may be a distinct, standalone component and may be in electronic communication (for example, wired, wireless, Bluetooth, etc.) with electronic device 100.

Figure 2:
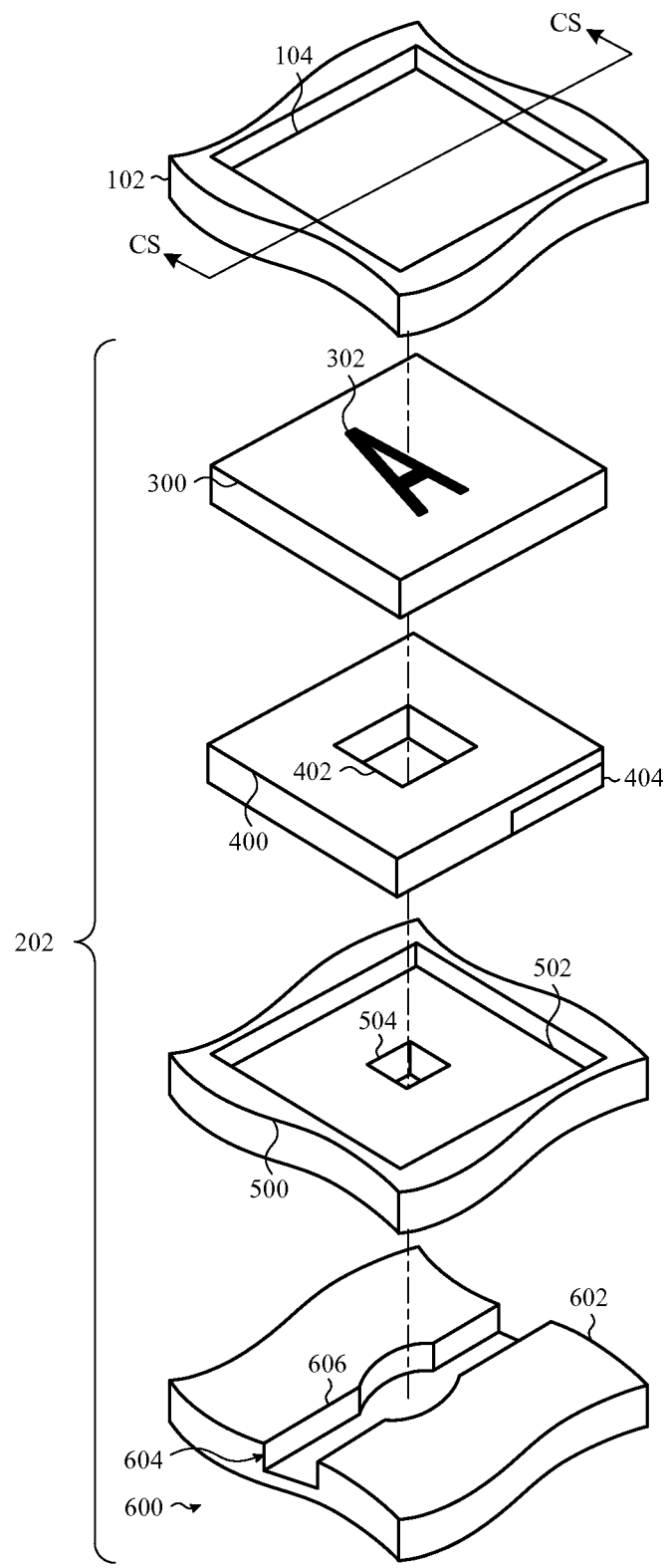
FIG. 2 shows an exploded view of a single key of the low-travel keyboard assembly of FIG. 1, according to embodiments.
Figure 3:
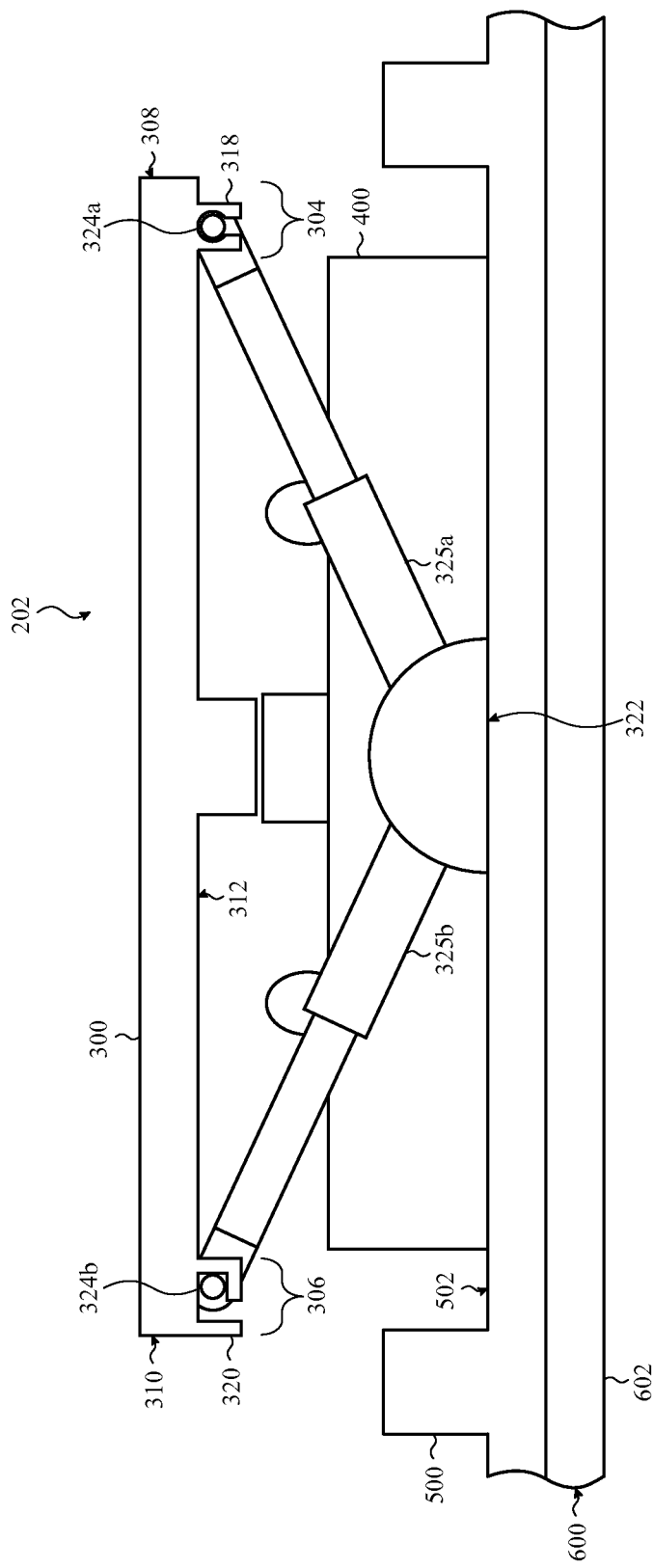
FIG. 3 shows a side view of a key assembly of a low-travel keyboard assembly including a keycap and a hinge mechanism, according to embodiments.

FIG. 2 shows a detailed exploded view of a portion of top case 102 of electronic device 100 and a single key structure 202 of low-travel keyboard assembly 200. FIG. 3 shows a cross-section view of electronic device 100 and low-travel key structure 202, taken along line CS-CS in FIG. 2. It is understood that similarly named components or similarly numbered components may function in a substantially similar fashion, may include similar materials and/or may include similar interactions with other components. Redundant explanation of such components has been omitted for clarity.

As shown in FIGS. 2 and 3, top case 102 of electronic device 100 may include one or more keyholes 104 formed therethrough. Top case 102 may also include supports, such as ribs, positioned between the keycaps 300, and may substantially surround and/or may be positioned within the space between the keycaps 300 of low-travel keyboard assembly 200.

Low-travel keyboard assembly 200 may be formed from a number of layers or components positioned adjacent to and/or coupled to one another. The components positioned in layers may be positioned adjacent to and/or coupled to one another and may be sandwiched between top case 102 and a bottom case (not shown) of electronic device 100.

The keycaps 300 of low-travel keyboard assembly 200 may be positioned within and extend through and/or partially above key holes 104 of top case 102. Each of the keycaps 300 may include a glyph 302 positioned on a top or exposed surface of the keycap 300. Each glyph 302 of keycap 300 may be substantially transparent to allow a light to be emitted through and/or illuminate keycap 300. In a non-limiting example, keycap 300 may be substantially opaque, except for glyph 302, which may be transparent to allow light to be emitted through keycap 300. Additionally, the perimeter of keycap 300 (see, FIG. 2) may be substantially illuminated by light emitted between the space between keycap 300 and skeletal ribs 106 of top case 102.

The keycaps 300 may be positioned above corresponding switch housings 400 of low-travel keyboard assembly 200 and may interact with a corresponding switch housing 400. As shown in FIG. 3, and discussed in detail herein, keycap 300 may include at least one first retaining member 304 positioned on a first side 308 of keycap 300 and at least one second retaining member 306 positioned on a second side 310 of keycap 300, opposite the first side. The retaining members 304, 306 may be formed on an underside 312 of keycap 300 adjacent switch housing 400 of low-travel keyboard assembly 200. As discussed herein, the retaining members 304, 306 may be utilized to couple keycap 300 within low-travel keyboard assembly 200 and, specifically, to connect keycap 300 to a hinge mechanism 322 coupled to a PCB 500. Additionally, and as discussed herein, retaining members 304, 306 aid in the removal of keycap 300 from keyboard assembly 200 without damaging keycap 300, hinge mechanism 322, and/or other components of keyboard assembly 200.

As shown in FIG. 2, each switch housing 400 of low-travel keyboard assembly 200 may include a dome switch opening 402 formed completely through switch housing 400, and a light source recess 404 formed within each switch housing 400. As discussed herein, dome switch opening 402 may receive and/or house a dome switch 406 (see, FIG. 9) for low-travel keyboard assembly 200 which forms an electrical signal to interact with electronic device 100 (see, FIG. 1). Light source recess 404 formed in switch housing 400 may receive a light source assembly 900 (see, FIG. 9), which may emit light through switch housing 400 for illuminating keycap 300 of low-travel keyboard assembly 200. As discussed herein in detail with respect to FIGS. 9 and 10, switch housing 400 can be formed using a double-shot molding process such that a body of the switch housing is formed from a first material, and a top panel integrally formed with the body portion, may be overmolded or otherwise formed from a second material. Additionally discussed herein, each of the first and second material provides benefits (e.g., rigid support, protective intermediate layer, light guide properties, and so on) to keyboard assembly 200.

Low-travel keyboard assembly 200 may also include a printed circuit board (PCB) 500 positioned below the group of switch housings 400. As shown in FIGS. 2 and 3, PCB 500 may include a number of recesses 502 formed within PCB 500, where each recess 502 of PCB 500 may receive a corresponding switch housing 400 of low-travel keyboard assembly 200. Each switch housing 400 may be positioned completely within and coupled to the surface of recess 502 of PCB 500. The PCB 500 may act as a substrate supporting the switch housing(s) 400. Further, one or more hinge mechanisms (described below) may be connected to the PCB. In some embodiments, a substrate other than the PCB 500 may be used. For example, a dedicated support structure or layer may be used and the PCB positioned below or above such a layer.

PCB 500 may also include an aperture 504 formed completely through PCB 500 in recess 502. As shown in FIG. 2, aperture 504 of PCB 500 may be substantially aligned with dome switch opening 402 of switch housing 400 of low-travel keyboard assembly 200. As discussed herein, the apertures 504 of PCB 500 may be utilized to receive a portion of dome switch 406 positioned within switch housing 400 when dome switch 406 is collapsed or compressed by keycap 300.

Low-travel keyboard assembly 200, as shown in FIGS. 2 and 3, may include a keyboard shield 600 positioned below PCB 500. Keyboard shield 600 may be formed from a conductive adhesive sheet 602 adhered to PCB 500 opposite switch housing 400. Conductive adhesive sheet 602 of shield 600 may include a venting system 604 which vents air expelled from switch housing 400 when dome switch is collapsed by keycap 300, as discussed herein. As shown in FIGS. 2 and 3, venting system 604 may include a group of channels 606 formed within and/or partially through conductive adhesive sheet 602 of shield 600 which may be in fluid communication and/or may be substantially aligned with dome switch opening 402 formed in switch housing 400 and aperture 504 formed through PCB 500. Conductive adhesive sheet 602 of keyboard shield 600 may be utilized to transmit signals to and/or from PCB 500 of keyboard assembly 200 during user interaction.

As shown in FIG. 3, each of the retaining members 304, 306 of keycap 300 may include distinct retaining features 318, 320. That is, first retaining members 304 may include a first retaining feature 318 and second retaining members 306 may include second retaining feature 320, distinct from the first retaining feature 318. The distinct retaining features 318, 320 may be utilized to couple keycap 300 within low-travel keyboard assembly 200 and, specifically, to couple keycap 300 to a hinge mechanism 322 coupled to PCB 500.

The distinct retaining features 318, 320 of keycap 300 may take the form of snap-fits, ball-and-socket fits, magnetic fits or slide retention fits. As shown in FIG. 3, first retaining feature 318 of first retaining member 304 may be a snap-fit for retaining a first retaining feature of the hinge mechanism 322, such as a first retention pin 324a of a first arm 325a, within first retaining member 304. Additionally, as shown in FIG. 3, second retaining feature 320 of second retaining member 306 may be a slide-retention fit for retaining a second retaining feature of the hinge mechanism 322, such as a second retention pin 324b of second arm 325b, within second retaining member 306.

As shown in FIG. 3, and briefly discussed herein, hinge mechanism 322 may include a number of retention pins 324a, 324b, which may be positioned within and/or coupled to the distinct retaining features 318, 320 of the retaining members 304, 306 of keycap 300. Hinge mechanism 322, as shown in FIG. 3, may take the form of any suitable hinge mechanism 322 capable of moving keycap 300 from an rest or undepressed state to a depressed state, including but not limited to: a butterfly or V-shaped hinge mechanism, a scissor hinge mechanism, a telescoping hinge mechanism or a sliding hinge mechanism. In many embodiments, the hinge mechanism 322 cooperates with the arms 325a, 325b to form a butterfly support for the keycap. The hinge mechanism 322 may be an elastomer coupling the arms together, as one example; such an elastomer may partially or fully encapsulate one or both of the arms. As another alternative, the hinge mechanism 322 may be co-molded with the arms 325a, 325b to form a living hinge therebetween. In still other embodiments using a butterfly or V-shaped structure, the hinge mechanism 322 may be a mechanical interlock between the arms. The mechanical interlock may be formed at the ends of each arm 325a, 325b and permit the arms to be retained together but move downward when a force is exerted on an associated keycap 300. Other structures are suitable and contemplated for the hinge mechanism 322.

Additionally, hinge mechanism 322 may be coupled to and/or positioned within recess 502 of PCB 500 and is depicted as a butterfly hinge in the current embodiment. Generally and in the present embodiment, the "butterfly" structure resembles a V-shaped structure in which the two arms of the V are joined by a hinge. The hinge is positioned approximately underneath a center of the keycap and affixed to a substrate, while the ends of the arms that are not joined by the hinge are received by the keycap or other structures joining them to the keycap. Accordingly, when the key is being pressed, the arms may move downward towards the hinge and substrate to permit the key to collapse. In some embodiments the arms may be parallel or near-parallel to the substrate when the key is fully depressed, while in others they may still extend from the hinge at an angle to the substrate even when the key is in its maximum travel position. This is a general overview of the butterfly structure; more specifics are given herein and other embodiments may vary any or all of the foregoing.

The two arms 325a, 325b extend upwardly from the body of hinge mechanism 322. Each arm 325a, 325b is connected to the keycap 300 and to the body of the hinge mechanism 322. As the keycap 300 is pressed downward, the arms 325a, 325b connected to the butterfly hinge may collapse to permit downward motion of the keycap 300.

In some embodiments, one or more of the arms 325a, 325b may be fixed with respect to the hinge mechanism and may move with respect to the keycap 300. In certain embodiments, one or more of the arms 325a, 325b may be fixed with respect to the keycap 300 and slide within or adjacent the hinge mechanism 322. In still other embodiments, one arm 325a may be fixed with respect to the keycap 300 and one arm 325b may slide with respect to the keycap 300. Here, for example, the retaining feature or retention pin 324a of the first arm 325a may be snap-fitted into retaining feature 318, and so may be fixed with respect to the keycap 300. A second arm 325b may be slidably received in a grooved retaining feature 320 and so may move with respect to the keycap 300 when the keycap 300 is depressed.

Figure 4:
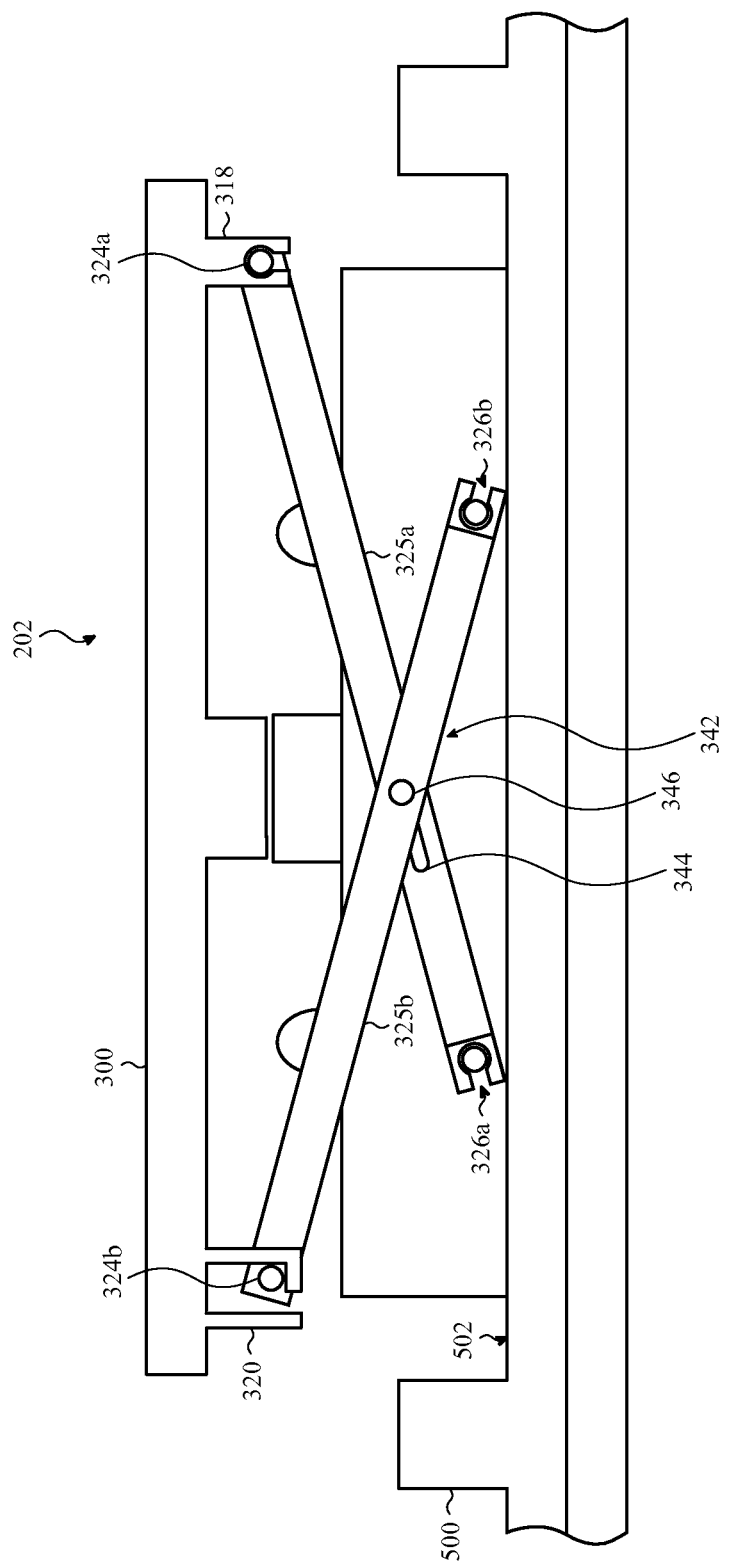
FIG. 4 shows a side view of a key assembly of a low-travel keyboard assembly including a keycap and a hinge mechanism, according to additional embodiments.

In another non-limiting example shown in FIG. 4, a base 326a, 326b of the first and/or second arms 325a, 325b may be snap-fitted or slide-fitted within hinge mechanism 342. In certain embodiments, a snap-fit may couple the base 326a, 326b of an arm 325a, 325b to various layers of the keyboard assembly 200 (e.g., PCB 500). In the non-limiting example shown in FIG. 4, base 326a, 326b of arms 325a, 325b of hinge mechanism 342, configured as a distinct butterfly hinge, may have snap-fits or slide-fits for coupling arms 325a, 325b to PCB 500. As shown in FIG. 4, the first arm 325a including retention pin 324a may be snap-fitted into both the keycap 300 and the PCB 500. In such embodiments, the second arm 325b including retention pin 324b may be snap-fitted or slide-fitted into the keycap 300 and/or the PCB 500; snap-fitting the second arm 325b may cause the slide-fitted portion of the second arm 325b to travel further laterally than if the base 326b of the second arm 325b were also slide-fitted. The use of a snap-fit to secure the butterfly hinge (e.g., hinge mechanism 322) to the PCB 500 may reduce failure of the hinge mechanism 322 by stabilizing the arm or arms 325a, 325b, as well as reducing the likelihood that one or both arms 325a, 325b slip free of a retaining feature (such as a snap-fit retaining feature 318 or slide-fit retaining feature 320) due to over-travel of retention pins 324a, 324b of hinge mechanism 322 or the like. In the non-limiting example shown in FIG. 4, hinge mechanism 342 may also include a slide-opening 344 formed through arm 325a configured to receive a coupling screw, rivet or pin 346 (hereafter, "coupling pin 346") that couples arm 325a of hinge mechanism 342 to arm 325b. Additionally, coupling pin 346 may be configured to slide and/or move within slide-opening 344 to aid in and/or allow keycap 300 to be depressed, as discussed herein.

Figure 5:
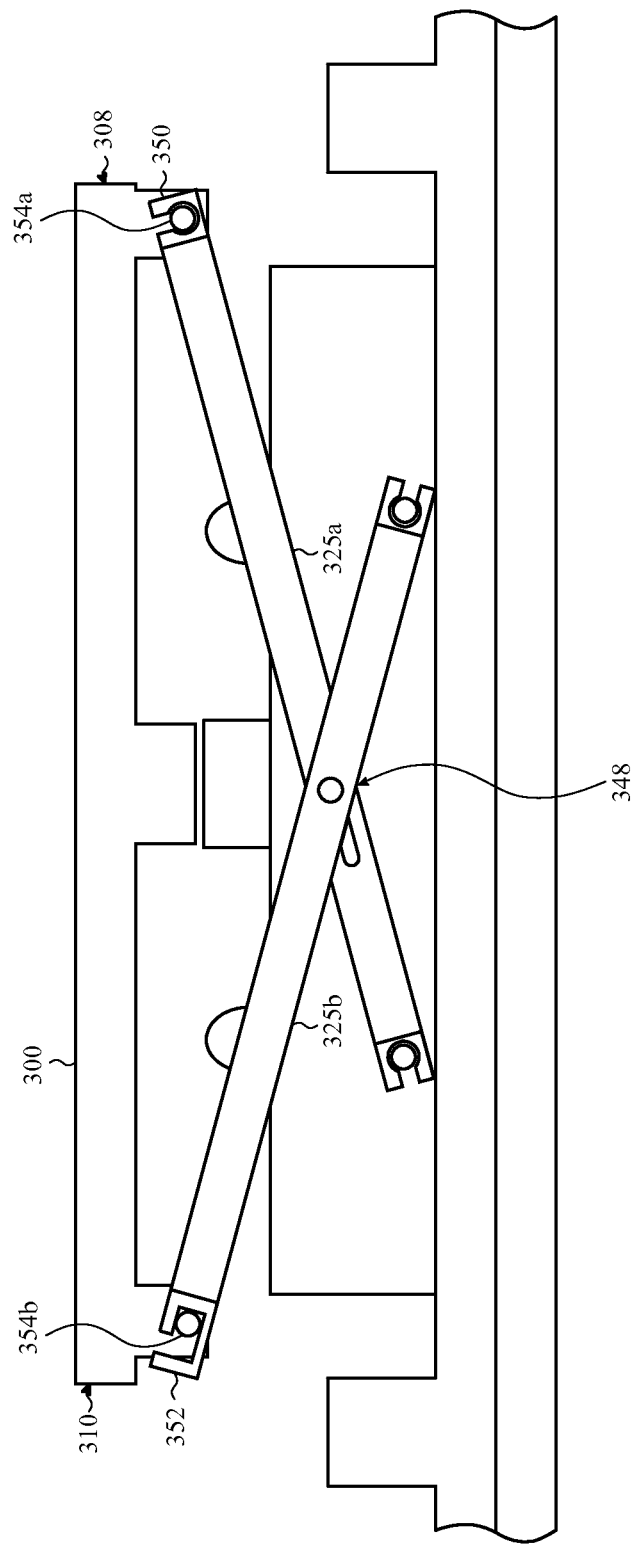
FIG. 5 shows a side view of a key assembly of a low-travel keyboard assembly including a keycap and a hinge mechanism, according to further embodiments.

In another non-limiting embodiment shown in FIG. 5, hinge mechanism 348 may include retaining features similar to those of keycap 300 discussed herein with respect to FIGS. 3 and 4. As shown in FIG. 5, first arm 325a may have a first retaining feature 350 formed as a snap-fit, similar to the first retaining 318 feature of keycap 300 as shown in FIG. 3, and discussed herein. Additionally, second arm 325b may have a second retaining feature 352 formed as a slide-retention fit, similar to the second retaining feature 320 of keycap 300 as shown in FIG. 3, and discussed herein. Distinct from FIGS. 3 and 4, keycap 300 may include distinct retaining features, such as retention pins 354a, 354b. The retention pins 354a, 354b of keycap 300 may function substantially similar to the retention pins formed on the hinge mechanism 348 as shown and discussed with respect to FIG. 3. In the non-limiting example shown in FIG. 5, retention pin 354a positioned adjacent first side 308 of keycap 300 may be coupled to and/or positioned within first retaining feature 350 of hinge mechanism 348. Retention pin 354b positioned adjacent second side 310 of keycap 300 may be coupled to and/or positioned within second retaining feature 352 of hinge mechanism 348. As discussed herein, retention pins 354a, 354b may be coupled to the first and second retaining features 350, 352 to couple keycap 300 to hinge mechanism 348.

Figure 6:
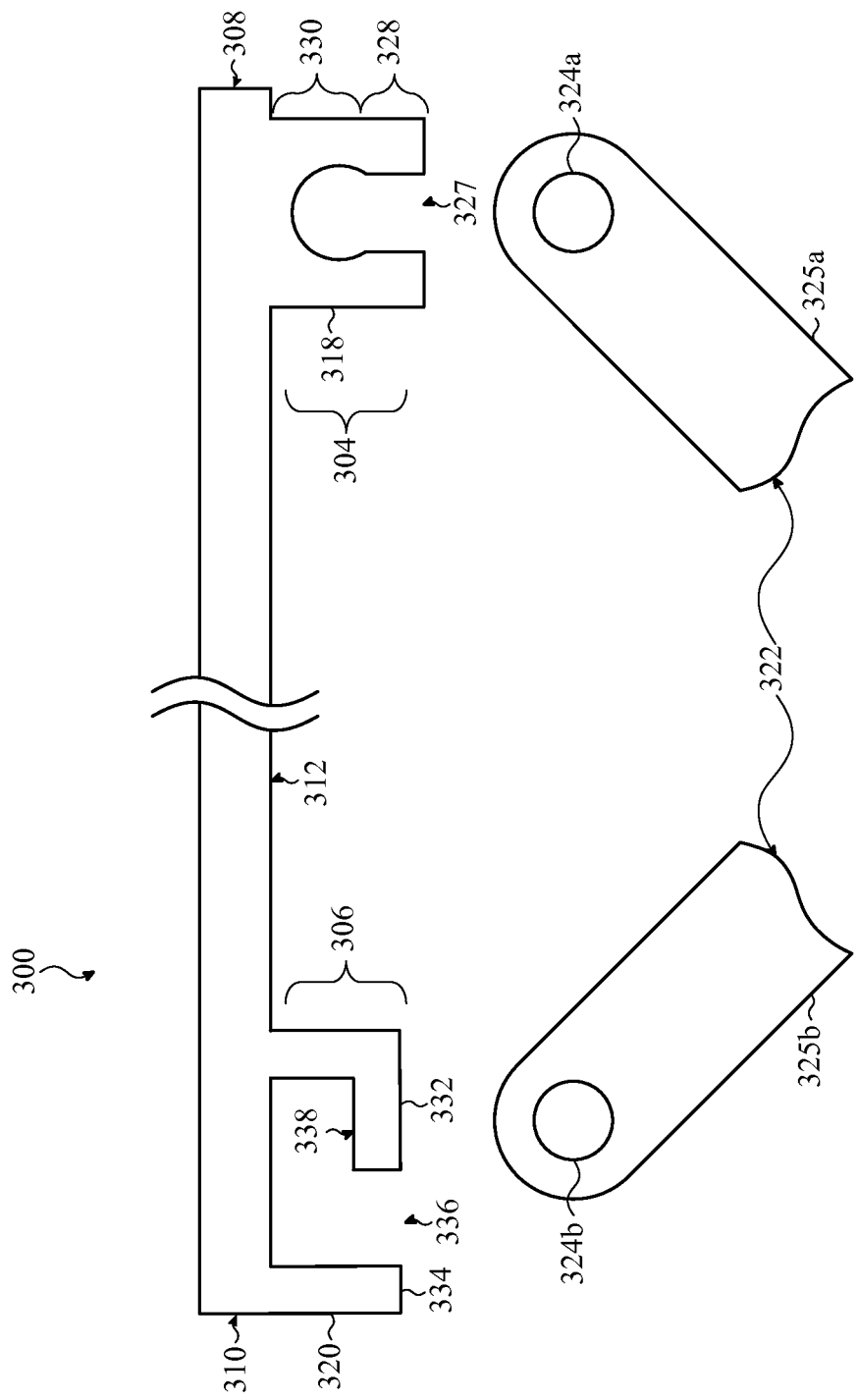
FIG. 6 shows a portion of a keycap and hinge mechanism of a low-travel keyboard assembly, according to embodiments.

Turning to FIG. 6, a side view of keycap 300 and a portion of hinge mechanism 322 of FIG. 3 is shown, according to embodiments. As shown in FIG. 6, and discussed herein in FIG. 3, first retaining feature 318 of first retaining member 304 may be a snap fit. More specifically, first retaining feature 318 of first retaining member 304 may be an opening 327 for receiving retention pin 324a of first arm 325a of hinge mechanism 322. The opening 327 of first retaining feature 318 may be a first portion 328 having a width smaller than a width of retention pin 324a. The width of first portion 328 may be smaller than the width of retention pin 324a to secure retention pin 324a within first retaining member 304 during operation of low-travel keyboard assembly 200. Opening 327 of first retaining feature 318 may also include a second portion 330 in communication with first portion 328, where second portion 330 has a width equal to, or larger than, the width of retention pin 324a. When keycap 300 is coupled to hinge mechanism 322, retention pin 324a may be positioned within second portion 330 of opening 327 of first retaining feature 318 and may be maintained within second portion 330 as a result of the width of first portion 328 being smaller than the width of retention pin 324a.

Additionally, as shown in FIG. 6, and discussed herein in FIG. 3, second retaining feature 320 of second retaining member 306 may be a slide retention fit. More specifically, second retaining feature 320 of second retaining member 306 may include a ledge portion 332, a protrusion wall 334 positioned adjacent ledge portion 332, and an aperture 336 positioned between ledge portion 332 and protrusion wall 334. Aperture 336 of second retaining feature 320 may receive retention pin 324b of second arm 325b of hinge mechanism 322 and may allow retention pin 324b to be positioned on a contact surface 338 of ledge portion 332 to couple second side 310 of keycap 300 to second arm 325b of hinge mechanism 322. That is, when keycap 300 is coupled to hinge mechanism 322, retention pin 324b may be positioned and/or rest on contact surface 338 of ledge portion 332 and may remain in contact with ledge portion 332 when keycap 300 is moved from a rest/default (e.g. undepressed) state to a depressed state, as discussed herein. Similar structures may be used to affix the arms of the hinge mechanism 322 to the housing, base plate, stiffening structure, or the like.

Figure 7:
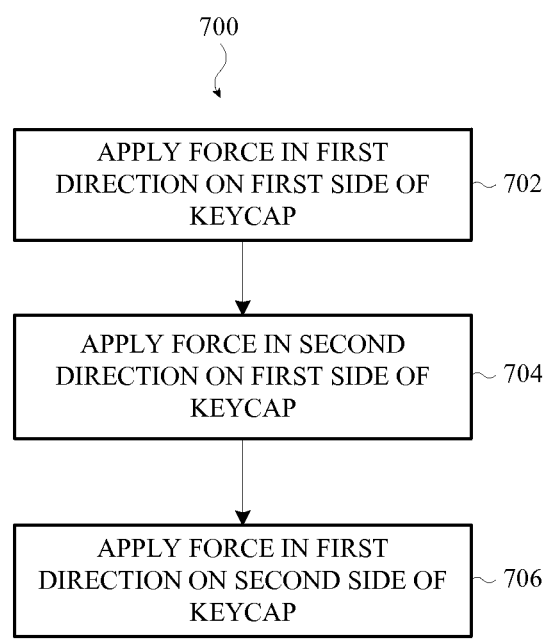
FIG. 7 shows a flow chart illustrating a method uncoupling a keycap from a hinge mechanism of a low-travel keyboard assembly. This method may be performed on the keycap as shown in FIG. 6.

FIG. 7 depicts an example process for removing keycap 300 from low-travel keyboard assembly 200. Specifically, FIG. 7 is a flowchart depicting one example process 700 for uncoupling keycap 300 from hinge mechanism 322 of low-travel keyboard assembly 200.

In operation 702, a force may be applied in a first direction on a first side of the keycap. The first side of the keycap may include a first retaining feature releasably coupled to a retention pin of a hinge mechanism of the keyboard assembly. The first direction in which the force is applied may be a direct opposite to the hinge mechanism coupled to the first retaining feature of the keycap. In response to applying the force in the first direction, the first retaining feature may be uncoupled from the retention pin of the hinge mechanism. In addition to applying the force on the first end, the keycap may pivot and/or rotate about a second end of the keycap. More specifically, the keycap may pivot and/or rotate about a second retaining feature positioned on the second end of the keycap where the second retaining feature remains releasably coupled to a distinct retention pin of the hinge mechanism.

In operation 704, a force may be applied in a second direction on the second side of the keycap. More specifically, a force may be applied to the second side of the keycap including the second retaining feature in a second direction where the second direction is distinct from the first direction in operation 702. The second direction in which the force is applied may be substantially parallel to the pivoted or rotated keycap. The force applied in the second direction may stop the pivoting or rotating of the keycap about the second retaining feature and may reposition the retention pin of the hinge mechanism within the second retaining feature of the keycap.

In operation 706, a force may be applied to the second side of the keycap in the first direction. That is, a force may be applied to the second side of the keycap including the second retaining feature in a first direction similar to the first direction in operation 702. Also similar to operation 702, the first direction in which the force is applied may be directly opposite to the hinge mechanism coupled to the second retaining feature of the keycap. In response to applying the force in the first direction on the second side of the keycap, the second retaining feature may be uncoupled from the retention pin of the hinge mechanism, and, ultimately, the keycap may be completely uncoupled from the hinge mechanism.

Turning to FIGS. 8A-8E, keycap 300 is depicted undergoing various operations of process 700 of FIG. 7. It is understood that similarly named components or similarly numbered components may function in a substantially similar fashion, may include similar materials, and/or may include similar interactions with other components. Redundant explanation of these components has been omitted for clarity.

Figure 8A:
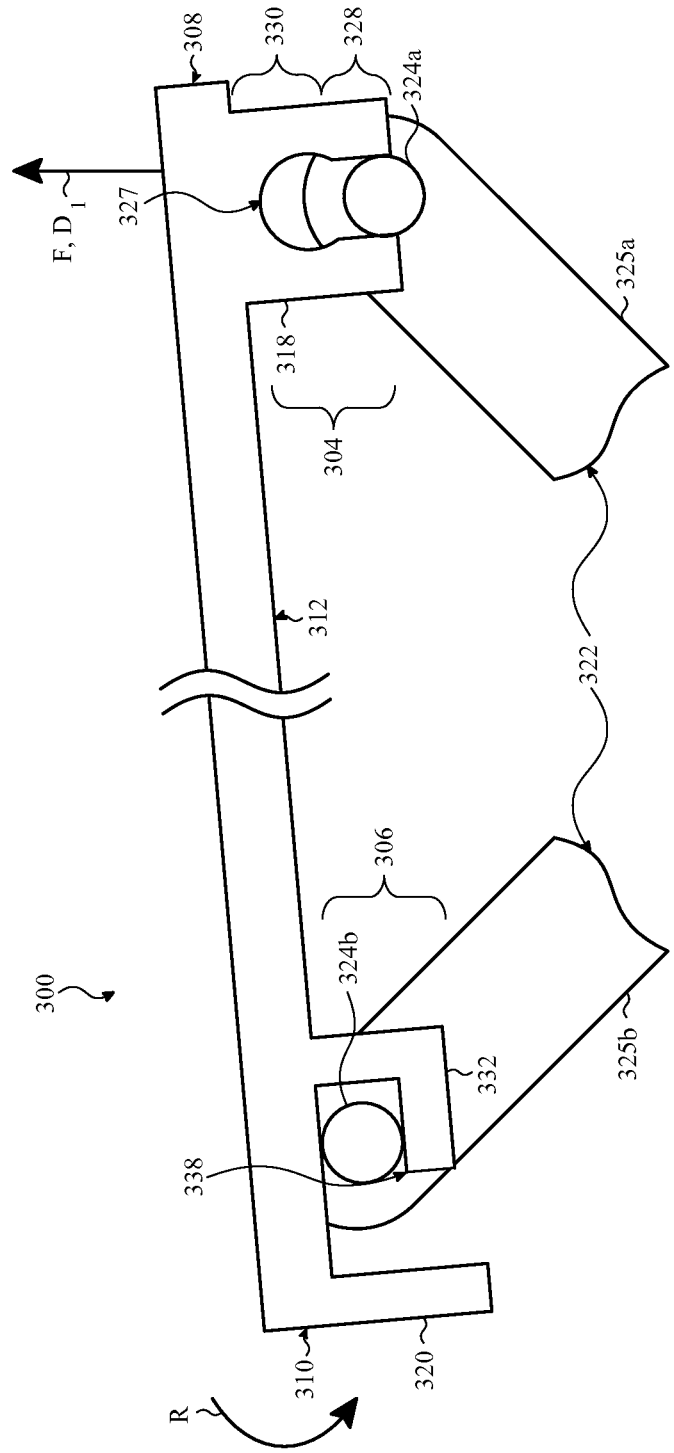
FIG. 8A shows an enlarged view of a keycap of a low-travel keyboard assembly in the process of having a first side uncoupled from a hinge mechanism by being moved in a first direction, according to embodiments.
Figure 8B:
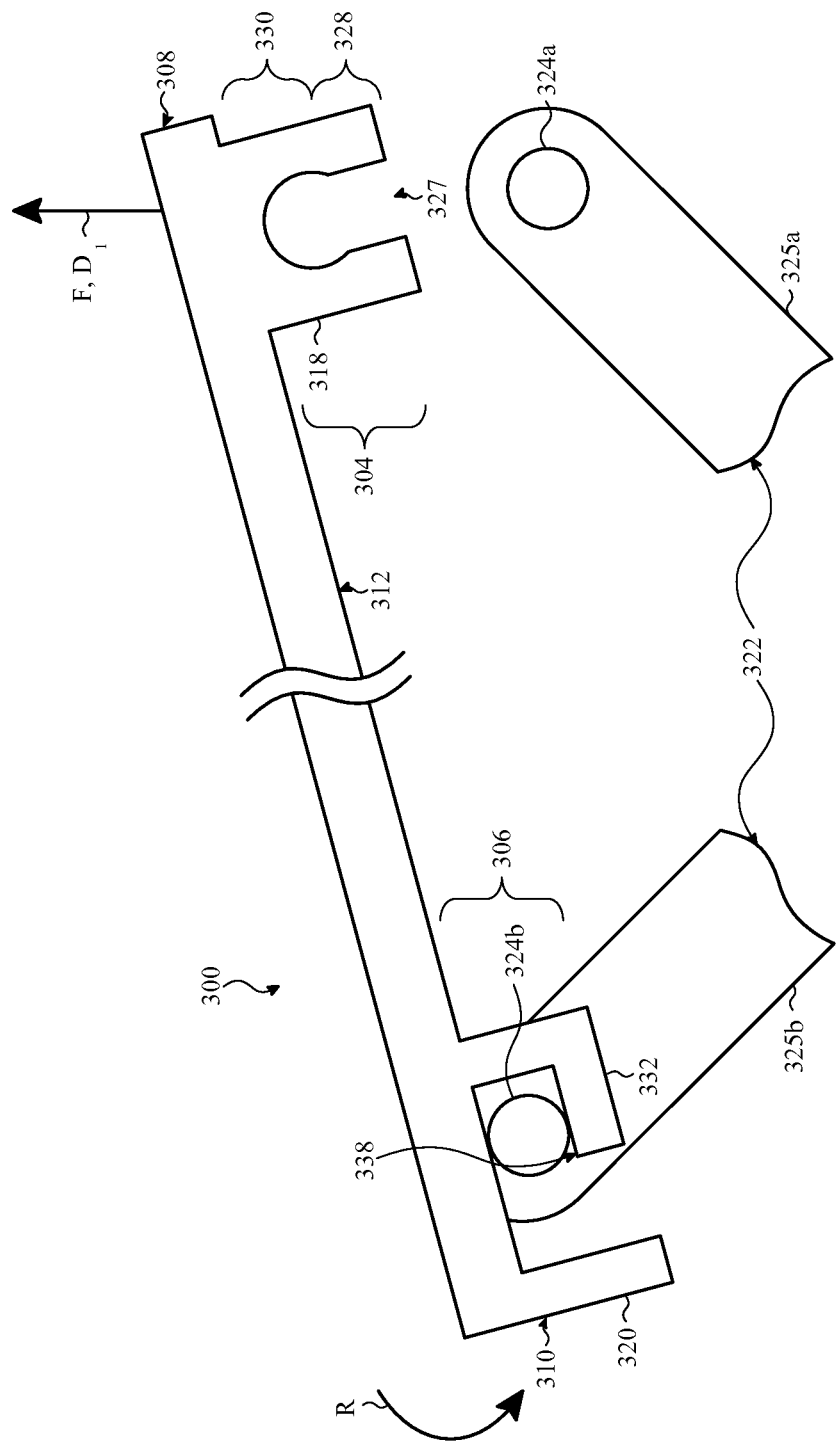
FIG. 8B shows the first side of the keycap of FIG. 8A uncoupled from the hinge mechanism, according to embodiments.

FIGS. 8A and 8B depict a force (F) being applied in a first direction ($D_1$) on first side 308 of keycap 300. More specifically, a force (F) is applied above first retaining feature 318 of keycap 300 to uncouple first retaining member 304 from retention pin 324a of first arm 325a of hinge mechanism 322. As shown in FIGS. 8A and 8B, the force (F) may be applied in a first direction ($D_1$) opposite hinge mechanism 322. As a result of applying the force (F) in the first direction ($D_1$), retention pin 324a of first arm 325a may be removed from first retaining feature 318. More specifically, by applying the force (F) on first side 308 of keycap 300, retention pin 324a may be removed from second portion 330 of opening 327 and may slide through first portion 328 (see, FIG. 8A), until retention pin 324a is eventually removed from first portion 328 of opening 327 of first retaining feature 318 of keycap 300 (FIG. 8B). As discussed herein, the width of first portion 328 of opening 327 of first retaining feature 318 may be smaller than the width of retention pin 324a for maintaining retention pin within second portion 330. However, first retaining member 304 including first retaining feature 318 may be formed from a partially flexible material that may deform to allow retention pin 324a to slide through second portion 330 of first retaining feature 318 when the force (F) is applied in the first direction ($D_1$).

Also shown in FIGS. 8A and 8B, keycap 300 may rotate about second retaining feature 320 positioned on second side 310 of keycap 300 as a result of applying the force (F) in the first direction ($D_1$). That is, as a result of maintaining the releasable coupling between second retaining feature 320 of keycap 300 and retention pin 324b of arm 325b, during the application of the force (F) in the first direction ($D_1$) on first side 308, keycap 300 may pivot or rotate about second retaining feature 320 of second retaining member 306. As such, in addition to being releasably coupled to retention pin 324b, second retaining member 306 including second retaining feature 320 may also be pivotably coupled to retention pin 324b of hinge mechanism 322. Retention pin 324b may also remain in contact with contact surface 338 of ledge portion 332 of second retaining member 306. The applying of the force (F) in the first direction ($D_1$) to first side 308 of keycap 300, as shown in FIGS. 8A and 8B, may correspond to operation 702 of FIG. 7.

Figure 8C:
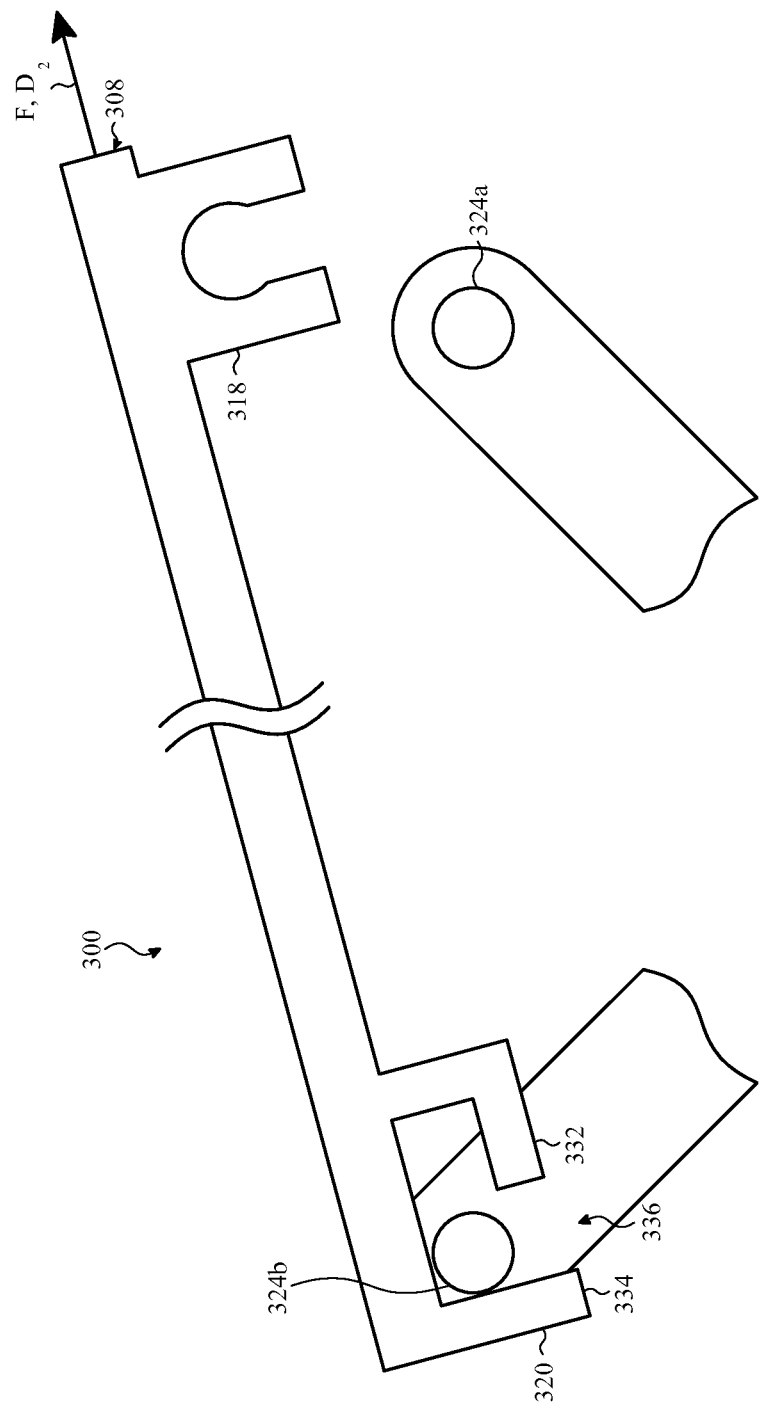
FIG. 8C shows the keycap of FIG. 8B being moved in a second direction, according to embodiments.

FIG. 8C depicts a force (F) being applied to keycap 300 in a second direction ($D_2$). Specifically, after first retaining feature 318 is uncoupled from retention pin 324a, the force (F) may be applied to first side 308 of keycap 300 in a second direction ($D_2$), distinct from the first direction ($D_1$), as shown and discussed in FIGS. 8A and 8B. The second direction ($D_2$) of the applied force may be substantially parallel to the pivoted or rotated keycap 300 to reposition retention pin 324b within second retaining feature 320. As shown in FIG. 8C, the application of the force (F) in the second direction ($D_2$) may reposition retention pin 324b within second retaining feature 320, such that retention pin 324b is no longer in contact with ledge portion 332 of second retaining feature 320, but is in contact with protrusion wall 334. Additionally, as shown in FIG. 8C, by applying the force (F) in a second direction ($D_2$) to reposition retention pin 324b to contact protrusion wall 334 of second retaining feature 320, retention pin 324b may be substantially aligned with aperture 336 of second retaining feature 320. The applying of the force (F) in the second direction ($D_2$) to first side 308 of keycap 300, as shown in FIG. 8C, may correspond to operation 704 of FIG. 7.

Figure 8D:
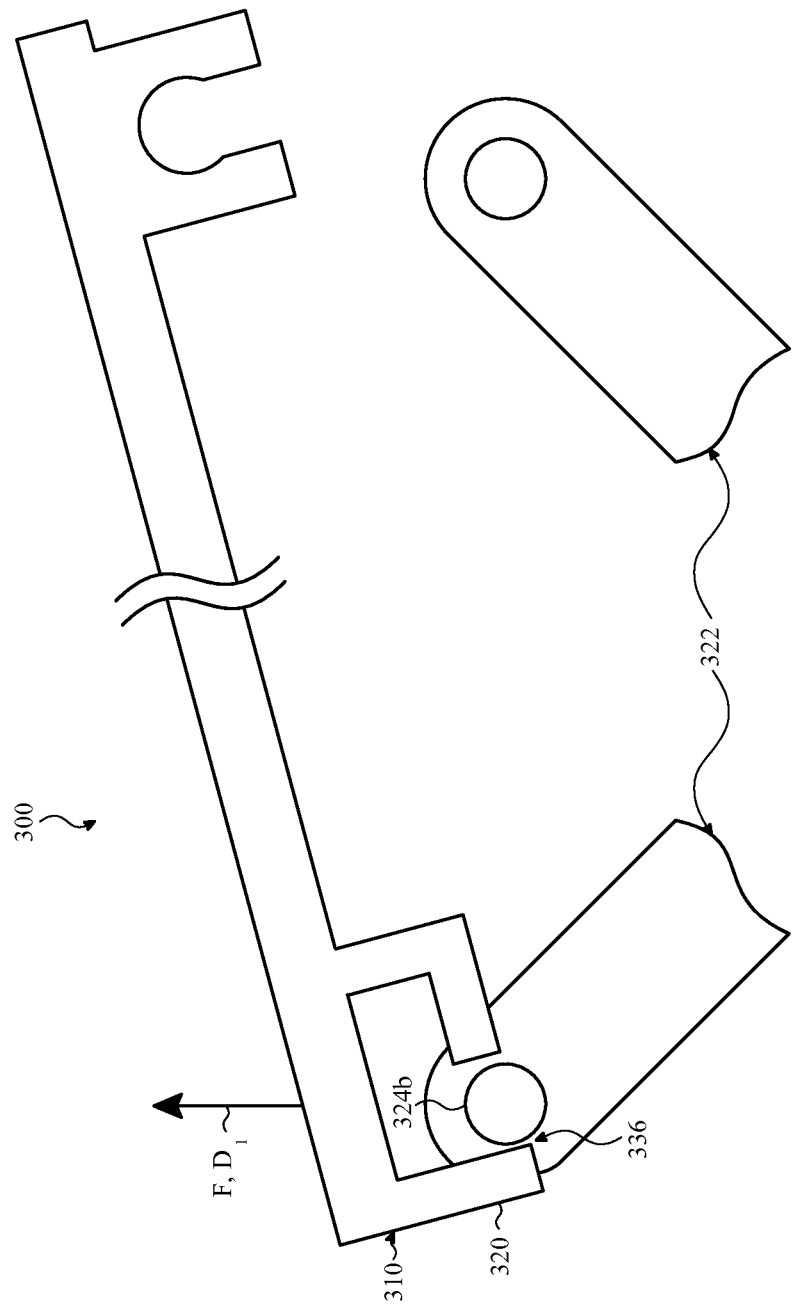
FIG. 8D shows the keycap of FIG. 8C having a second side being moved in the first direction, according to embodiments.
Figure 8E:
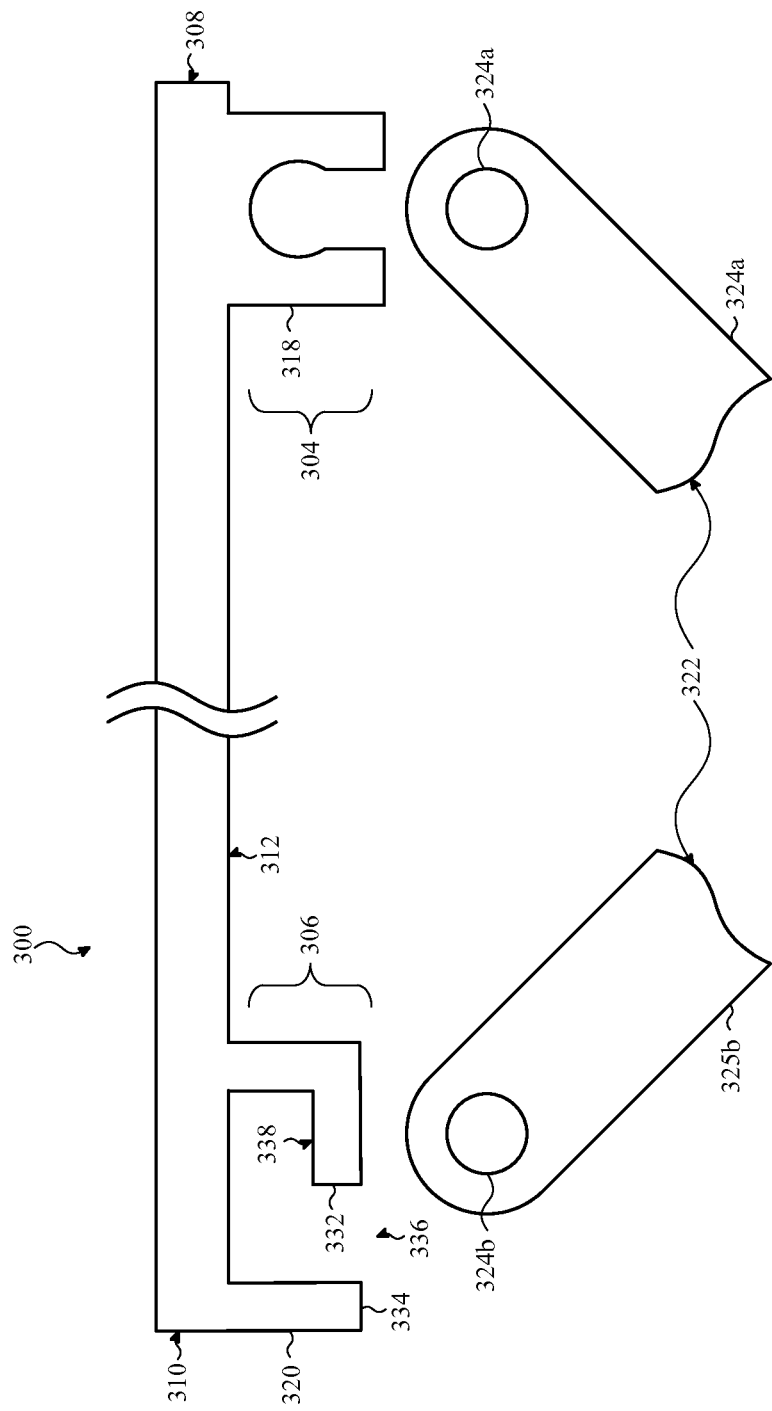
FIG. 8E shows the keycap of FIG. 8D uncoupled from the hinge mechanism, according to embodiments.

FIG. 8D depicts a force (F) being applied to keycap 300 in the first direction ($D_1$) on second side 310. That is, after retention pin 324b is repositioned within second retaining feature 320 to be aligned with aperture 336, the force (F) may be applied to second side 310 of keycap 300 in the first direction ($D_1$), similar to the first direction ($D_1$) shown and discussed in FIGS. 8A and 8B. As shown in FIG. 8D, the application of the force (F) in the first direction ($D_1$) may allow retention pin 324b to be removed from second retaining feature 320 of keycap 300 via aperture 336. As a result, keycap 300 may be completely uncoupled from hinge mechanism 322 (see, FIG. 8E). Applying the force (F) on keycap 300 (as shown in FIG. 8D) may correspond to operation 706 of FIG. 7.

It is understood that coupling keycap 300 to hinge mechanism 322 may be achieved by performing the process discussed in FIG. 7, and shown in FIGS. 8A-8E, in reverse. That is, second retaining feature 320 may be first coupled to retention pin 324b of hinge mechanism 322 and first retaining feature 318 may be subsequently coupled to a distinct retention pin 324. Additionally, and alternatively, first retaining feature 318 on first side 308 of keycap 300 may be coupled to retention pin 324a before second retaining feature 320 may be coupled to retention pin 324b. That is, first retaining feature 318 may be pivotably and releasably coupled to retention pin 324a of hinge mechanism 322, and keycap 300 may be subsequently translated (e.g., depressed) by applying a downward force on keycap 300 until the distinct retention pin 324b positioned adjacent second retaining feature 320 is aligned with and substantially moves into second retaining feature 320 via aperture 336. Once retention pin 324b is positioned within second retaining feature 320 of keycap 300, the force may be released and keycap 300 may return to its rest state with retention pin 324b now positioned within second retaining feature 320 on second side 310 of keycap 300.

Figure 9:
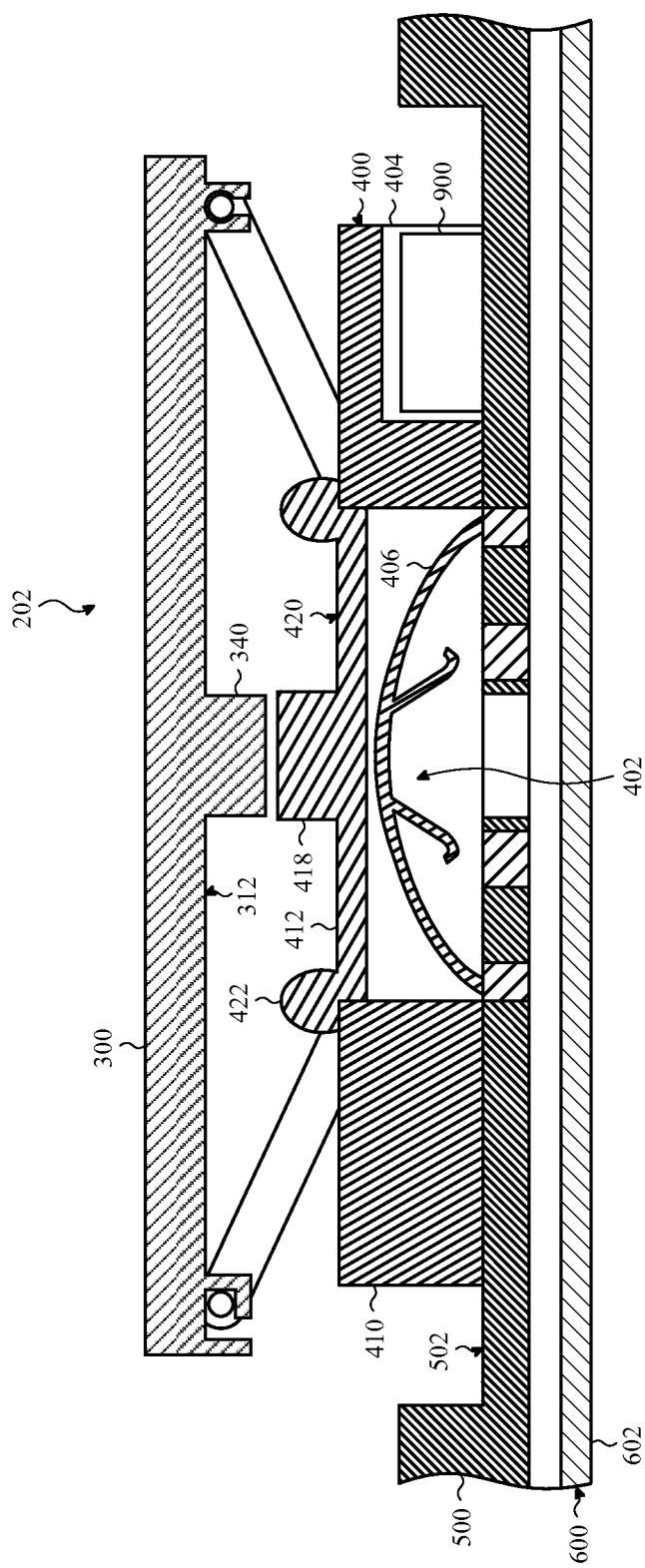
FIG. 9 shows a cross-section view of a low-travel keyboard assembly including a switch housing, according to embodiments. The cross-section view is taken along line CS-CS in FIG. 2.

FIG. 9 shows a front cross-sectional view of low-travel keyboard assembly 200 taken along line CS-CS in FIG. 2. Conductive adhesive sheet 602 of shield 600 is shown to be separated from PCB 500 of keyboard assembly 200 as a result of the line CS-CS forming cross-section of FIG. 9 being taken through a channel 606 (see, FIG. 2) of shield 600. It is understood that similarly named components or similarly numbered components may function in a substantially similar fashion, may include similar materials and/or may include similar interactions with other components. Redundant explanation of these components has been omitted for clarity.

As discussed herein, low-travel keyboard assembly 200 may include switch housing 400 positioned between keycap 300 and PCB 500. That is, switch housing 400 may be positioned within recess 502 of PCB 500 and may be coupled to PCB 500 adjacent keycap 300. Additionally, as discussed herein with respect to FIG. 2, switch housing 400 may define dome switch opening 402 formed through switch housing 400 and light source recess 404 formed through a portion of switch housing 400. As shown in FIG. 9, dome switch opening 402 may receive and/or house dome switch 406, which may be collapsed/compressed by keycap 300 to form an electrical connection to interact with electronic device 100 (see, FIG. 1). Additionally, as shown in FIG. 9, light source recess 404 of switch housing 400 may receive a light source assembly 900, which may emit a light through switch housing 400 to keycap 300 to provide a light around the perimeter of keycap 300 and transparent glyph (see, FIG. 2) formed through keycap 300.

Switch housing 400 may be defined by a body portion 410 and a top panel 412 formed integrally and molded to body portion 410. Body portion 410 of switch housing 400 may define dome switch opening 402 and light source recess 404 formed adjacent dome switch opening 402. Body portion 410 may be directly coupled to PCB 500 within recess 502, as shown in FIG. 9. Body portion 410 and top panel 412 of switch housing 400 may be formed from distinct materials. That is, body portion 410 may be formed from a first material having substantially rigid properties for supporting keycap 300 during operation of low-travel keyboard assembly 200 and/or protecting the various components (e.g., dome switch 406, light source assembly 900) included within switch housing 400. The first material forming body portion 410 of switch housing 400 may be transparent, semi-transparent, and/or translucent to permit light emitted by the light source assembly 900 to pass through body portion 410 toward keycap 300. Additionally, the first material of body portion 410 may reflect the light emitted by the light source assembly 900 to be redirected toward keycap 300.

Top panel 412 of switch housing 400 may be formed integrally with body portion 410. More specifically, as shown in FIG. 9, top panel 412 may be molded to, and formed integrally with, body portion 410 and may cover switch opening 402 formed in body portion 410. In a non-limiting example, top panel 412 may be formed integrally with body portion 410 using a double-shot housing formation process; the top panel 412 may be overmolded on the body portion 410. Top panel 412 may be formed from a second material, distinct from the first material forming body portion 410, and may be substantially flexible or deformable. As discussed herein, top panel 412 may substantially flex and protect dome switch 406 when keycap 300 is collapsed/compressed. In addition to being flexible, the second material forming top panel 412 may be substantially transparent to allow light to pass therethrough in order to illuminate keycap 300 and/or substantially reflective to redirect light toward keycap 300. Thus, it should be appreciated that top panel 412 may serve as a light guide for the key assembly. Although the element is referred to as a "top panel," it should be appreciated that the panel may take any suitable shape or dimension. Thus, although the top panel is substantially planar in many embodiments, it may be bowed, curved, stepped, angled or the like in others.

Top panel 412 may be formed over switch opening 402 to redirect light toward keycap 300 and to substantially protect dome switch 406 from undesired wear from keycap 300 during operation of low-travel keyboard assembly 200. When a force is applied to keycap 300 to translate keycap 300, keycap 300 may contact top panel 412 of switch housing 400, which may subsequently deform and collapse dome switch 406 to form an electrical connection. By providing a barrier between keycap 300 and dome switch 406, top panel 412 may reduce the wear on dome switch 406 over the operational life of low-travel keyboard assembly 200. Top panel 412 may also define a first contact protrusion 418 positioned on a surface 420 of top panel 412. First contact protrusion 418 may be positioned directly adjacent a second contact protrusion 340 formed on underside 312 of keycap 300. The first contact protrusion 418 of top panel 412 and the second contact protrusion 340 of keycap 300 may contact one another when keycap 300 is depressed and may more evenly distribute the force applied to top panel 412 and subsequently dome switch 406 when keycap 300 is depressed. By distributing the force through top panel 412 via the respective contact protrusions 340, 418, the wear on dome switch 406 may be further reduced over the operational life of low-travel keyboard assembly 200.

As shown in FIG. 9, top panel 412 may also define a set of edge protrusions 422 positioned on surface 420. Edge protrusions 422 may be formed as part of top panel 412 and, as such, may be formed from the substantially deformable second material discussed herein. As shown in FIG. 9, edge protrusions 422 may extend toward keycap 300 and may deform when keycap 300 is depressed, to form an electrical connection. That is, as keycap 300 moves toward top panel 412 to collapse dome switch 406, underside 312 of keycap 300 may substantially contact and deform edge protrusions 422 of top panel 412. Like first contact protrusion 418 of top panel 412, edge protrusions 422 may also distribute the force applied by keycap 300 to top panel 412 to reduce wear of the components low-travel keyboard assembly 200. Additionally, edge protrusions 422 may be used to soften the key's feel as the user interacts with keycap 300, as well as prevent a user from pressing keycap 300 too far into low-travel keyboard assembly 200 and potentially damaging electronic device 100 (see, FIG. 1). The edge protrusions 422 may also deform to permit top panel 412 to move downwardly in response to motion of the keycap 300. That is, the edge protrusions may stretch, extend or otherwise deform, thereby allowing the top panel 412 to travel.

The switch housing may be sized and shaped to encompass or otherwise contain the dome switch 406. Particularly, the body 410 may have a height that equals or exceeds a height of the dome switch 406, or any other switch within the housing. Further, the top panel 412 may abut a top of the dome switch 406 in some embodiments, while in others (and as illustrated in FIG. 9) the two may be spaced apart. Regardless, because the switch housing is at least as high as the dome switch in certain embodiments, it may protect the dome switch from foreign matter and certain impacts. Further, the top panel 418 may translate downwardly to impact and collapse the dome switch 406, for example, when the keycap 300 is pressed. The switch body 410, however, may not move during a keycap press. Thus, part of the switch housing may translate in order to collapse the dome switch 406 and part may not. Further, due to the relative heights of the body 410 and dome switch 406, the top panel 412 may deform into the switch housing in order to contact and collapse the dome switch. Thus, force exerted on the keycap may deform the top panel and collapse (or partially collapse) the dome switch while the body is unaffected by the force.

Figure 10:
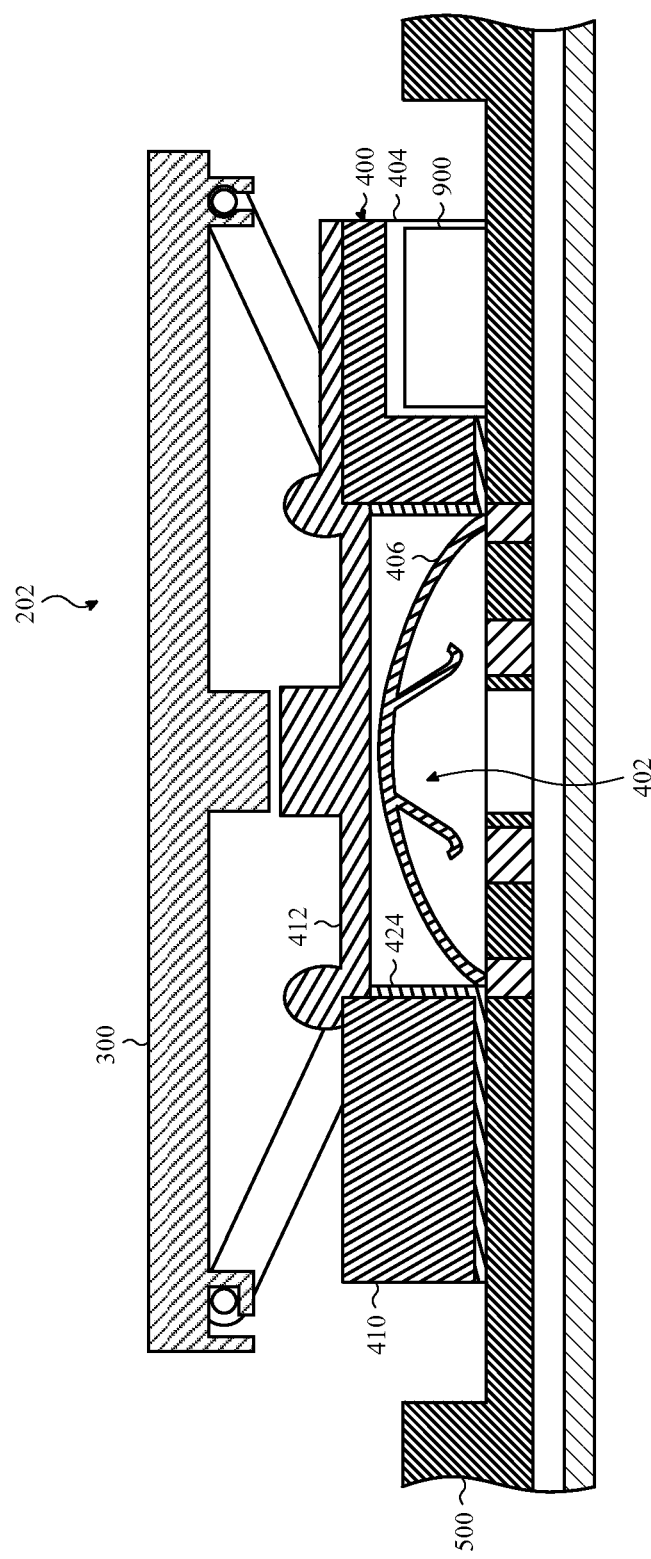
FIG. 10 shows a cross-section view of a low-travel keyboard assembly including a switch housing, according to another embodiment. The cross-section view is taken along line CS-CS in FIG. 2.

FIG. 10 shows a front cross-sectional view of low-travel keyboard assembly 200 taken along line CS-CS in FIG. 2, according to another non-limiting example. As shown in FIG. 10, switch housing 400 may also include gaskets 424 formed within select portions of switch housing 400. In the non-limiting example shown in FIG. 10, gaskets 424 may be formed in select portions of body portion 410 of switch housing 400 to substantially seal (e.g., waterproof) switch housing 400 and/or to aid in coupling switch housing 400 to PCB 500. As shown in FIG. 9, gaskets 424 may be formed around the entire sidewalls of switch opening 402 of body portion 410. Gaskets 424 may be formed between PCB 500 and top panel 412, such that switch opening 402 and, consequently, dome switch 406 may be substantially sealed within body portion 410 and/or sealed from outside contaminants (e.g., water) that may negatively impact the electrical connection of low-travel keyboard assembly 200. Additionally, gaskets 424 may be formed between body portion 410 of switch housing 400 and PCB 500 to aid in coupling switch housing 400 to PCB 500 and/or to seal all coupled edges between switch housing 400 and PCB 500 from outside contaminants.

Additionally shown in FIG. 10, top panel 412 may extend over the portion of body portion 410 including light source recess 404. More specifically, top panel 412 may be partially or fully positioned over light source recess 404, including light source assembly 900. Light emitted from light source assembly 900 may not pass through the portion of switch housing 400 positioned directly above light source recess 404 and/or light source assembly 900. As such, by extending top panel 412 over light source recess 404 formed in body portion 410, top panel 412 may aid in providing light from light source assembly 900 to keycap 300, as similarly discussed herein with respect to FIG. 9. The light source may be a light-emitting diode, an organic light-emitting diode, a cold cathode fluorescent lamp, a quantum dot, or any other suitable light source.

Although discussed herein as a keyboard assembly, it is understood that the disclosed embodiments may be used in a variety of input devices used in various electronic devices. That is, low-travel keyboard assembly 200 and the components of the assembly discussed herein may be utilized or implemented in a variety of input devices for an electronic device including, but not limited to: buttons, switches, toggles, wheels, and touch screens.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A key structure for a keyboard assembly, comprising:
 a switch housing, comprising:
  a body defining:
   a switch opening in a top surface; and
   a light source recess formed adjacent the switch opening; and
  a top panel coupled to the top surface of the body;
 a tactile dome positioned within the opening:
 a support structure coupled to the switch housing; and
 a keycap positioned above the body and pivotally coupled to the support structure, wherein:
 the top panel covers the tactile dome and deforms in response to movement of the keycap; and
 the top panel is a light guide.

2. The key structure of claim 1, wherein the keycap moves toward, and contacts, the top panel in response to the input.

3. The key structure of claim 1, wherein the top panel covers the light source recess of the body.

4. The key structure of claim 1, wherein:
 the body is formed from a first material;
 the top panel is formed from a second material different from the first material; and
 the top panel is overmolded on the portion of the body.

5. The key structure of claim 4, wherein the top panel includes one or more substantially deformable protrusions positioned on a surface of the top panel.

6. The key structure of claim 5, wherein the top panel includes a contact protrusion formed on the surface.

7. The key structure of claim 4, wherein the body has a rigidity that is greater than a rigidity of the top panel.

8. The key structure of claim 7, wherein the second material is substantially transparent and substantially reflective.

9. A key structure for a keyboard assembly, comprising:
 a keycap configured to translate in response to a force;
 a support structure pivotally connected to the keycap and configured to guide a translation of the keycap;
 a switch housing beneath the keycap and comprising:
  a body having an opening defined by a wall; and
  a top panel positioned between the body and the keycap and configured to deform in response to the translation of the keycap; and
 a tactile dome positioned within the opening and surrounded by the wall, the tactile dome configured to collapse as the top panel deforms.

10. The key structure of claim 9, wherein the top panel deforms into the switch housing in response to the force.

11. The key structure of claim 9, wherein a height of the body is greater than a height of the switch.

12. The key structure of claim 11, further comprising edge protrusions formed on the top panel; wherein
the keycap substantially contacts the edge protrusions in response to the force.

13. The key structure of claim 12, wherein the keycap substantially deforms at least one of the edge protrusions and the top panel of the switch housing in response to the force.

14. The key structure of claim 9, wherein the keycap includes a first contact protrusion positioned adjacent the top panel.

15. The key structure of claim 14, wherein the top panel comprises a second contact protrusion positioned adjacent to and in alignment with the first contact protrusion of the keycap.

16. The key structure of claim 15, wherein the first contact protrusion contacts the second contact protrusion in response to the force.

17. The key structure of claim 9, further comprising a printed circuit board (PCB) coupled to the switch housing.

18. The key structure of claim 17, wherein the switch housing further comprises gaskets formed on sidewalls of the switch housing for sealing the switch housing to the PCB.

19. A keyboard assembly, comprising:
a printed circuit board (PCB);
a V-shaped hinge mechanism coupled to the PCB and comprising a first retention pin and a second retention pin; and
a keycap releasably coupled to the hinge mechanism, and comprising:
a first retaining member positioned on an underside of the keycap proximate a first side of the keycap, and comprising a snap-fit feature releasably coupled to the first retention pin and configured to impede translational motion of the first retention pin in a direction substantially perpendicular to an actuation direction of the keycap; and
a second retaining member positioned on the underside of the keycap and proximate a second side of the keycap opposite the first side, the second retaining member comprising a slide-retention fit feature releasably coupled to the second retention pin.

20. The keyboard assembly of claim 19, wherein the snap-fit feature is pivotably coupled to the first retention pin.

21. The keyboard assembly of claim 19, wherein the slide-retention fit feature is pivotably coupled to the first retention pin.

22. The keyboard assembly of claim 19, wherein the snap-fit feature further comprises an opening for receiving the first retention pin.

23. The keyboard assembly of claim 22, wherein the opening defines:
a first portion having a width smaller than a width of the first retention pin; and
a second portion in communication with the first portion, and having a width at least equal to the width of the first retention pin.

24. The keyboard assembly of claim 19, wherein the V-shaped hinge mechanism facilitates moving the keycap from an undepressed state to a depressed state.

* * * * *